(12) United States Patent
Zhao et al.

(10) Patent No.: US 12,243,938 B2
(45) Date of Patent: Mar. 4, 2025

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Qiyue Zhao, Suzhou (CN); Yu Shi, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 17/623,593

(22) PCT Filed: Aug. 11, 2021

(86) PCT No.: PCT/CN2021/112113
§ 371 (c)(1),
(2) Date: Dec. 28, 2021

(87) PCT Pub. No.: WO2023/015495
PCT Pub. Date: Feb. 16, 2023

(65) Prior Publication Data
US 2024/0038886 A1  Feb. 1, 2024

(51) Int. Cl.
*H01L 29/778* (2006.01)
*H01L 23/528* (2006.01)
(Continued)

(52) U.S. Cl.
CPC ...... *H01L 29/7787* (2013.01); *H01L 29/2003* (2013.01); *H01L 29/404* (2013.01); *H01L 29/41775* (2013.01); *H01L 29/66462* (2013.01)

(58) Field of Classification Search
CPC ........... H01L 29/7787; H01L 29/66462; H01L 29/1066; H01L 29/7786; H01L 29/404;
(Continued)

(56) References Cited

U.S. PATENT DOCUMENTS

2016/0218189 A1* 7/2016 Oasa .................... H01L 29/7786
2017/0301781 A1* 10/2017 Boles ................ H01L 29/42312
2022/0093584 A1* 3/2022 Lee ........................ H01L 29/402

FOREIGN PATENT DOCUMENTS

CN      105938799 A      9/2016
CN      109585543 A      4/2019
(Continued)

OTHER PUBLICATIONS

International Search Report and Written Opinion of the corresponding PCT application No. PCT/CN2021/112113 mailed on May 9, 2022.

*Primary Examiner* — Sonya McCall-Shepard
(74) *Attorney, Agent, or Firm* — Li & Cai Intellectual Property (USA) Office

(57) ABSTRACT

A semiconductor device includes a first nitride-based semiconductor layer, a second nitride-based semiconductor layer, a first gate electrode, a first S/D electrode, and a first field plate. The second nitride-based semiconductor layer is disposed on the first nitride-based semiconductor layer. The first and second nitride-based semiconductor layers collectively have an active portion and an electrically isolating portion that is non-semi-conducting and surrounds the active portion to form at least two interfaces extending along a first direction and spaced apart from each other by the active portion. The first gate electrode and the first S/D electrode are disposed above the second nitride-based semiconductor layer. The first field plate is disposed above the second nitride-based semiconductor layer and extends along the second direction and across the two interfaces such that the
(Continued)

field plate extends to the electrically isolating portion, and overlaps with the first gate electrode near the interfaces.

17 Claims, 19 Drawing Sheets

(51) Int. Cl.
*H01L 29/06* (2006.01)
*H01L 29/10* (2006.01)
*H01L 29/20* (2006.01)
*H01L 29/40* (2006.01)
*H01L 29/417* (2006.01)
*H01L 29/423* (2006.01)
*H01L 29/66* (2006.01)

(58) Field of Classification Search
CPC .. H01L 23/485; H01L 29/402; H01L 29/2003
See application file for complete search history.

(56) References Cited

FOREIGN PATENT DOCUMENTS

| CN | 111527610 A | 8/2020 |
| CN | 112103337 A | 12/2020 |
| JP | 201686108 A | 5/2016 |

\* cited by examiner

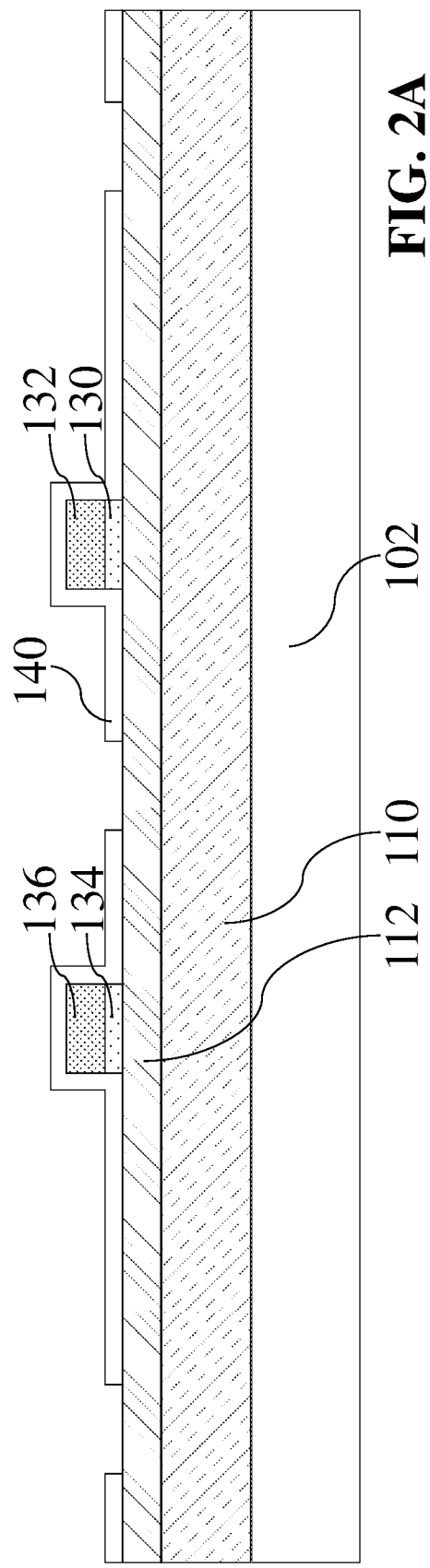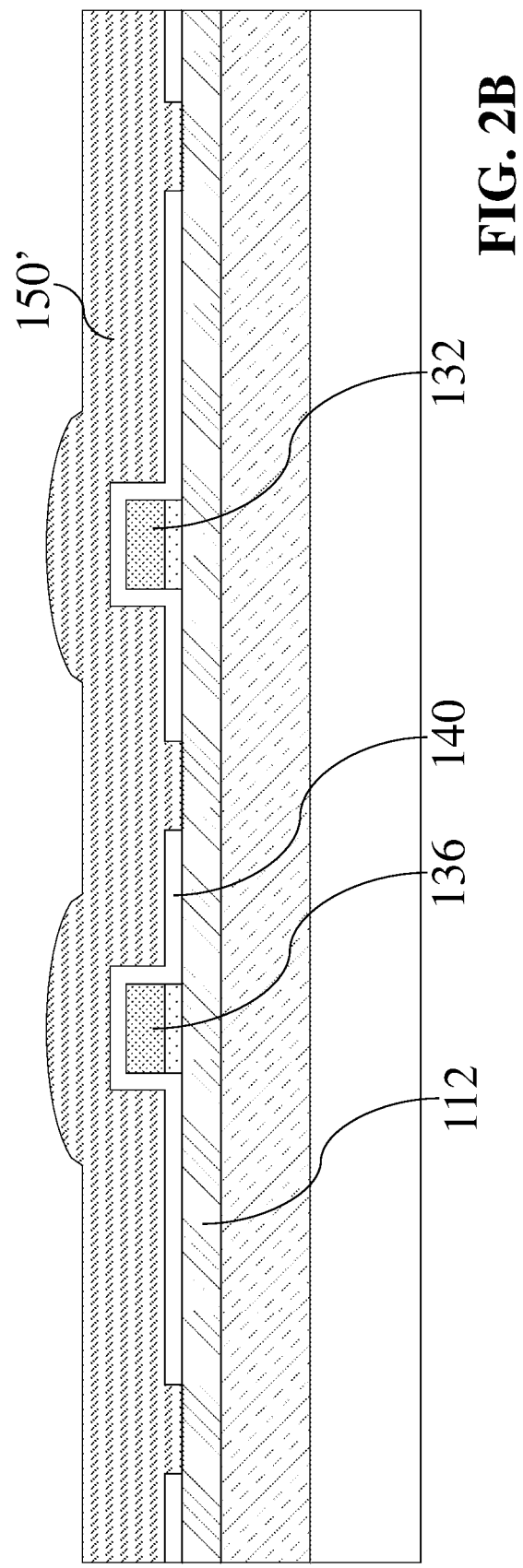

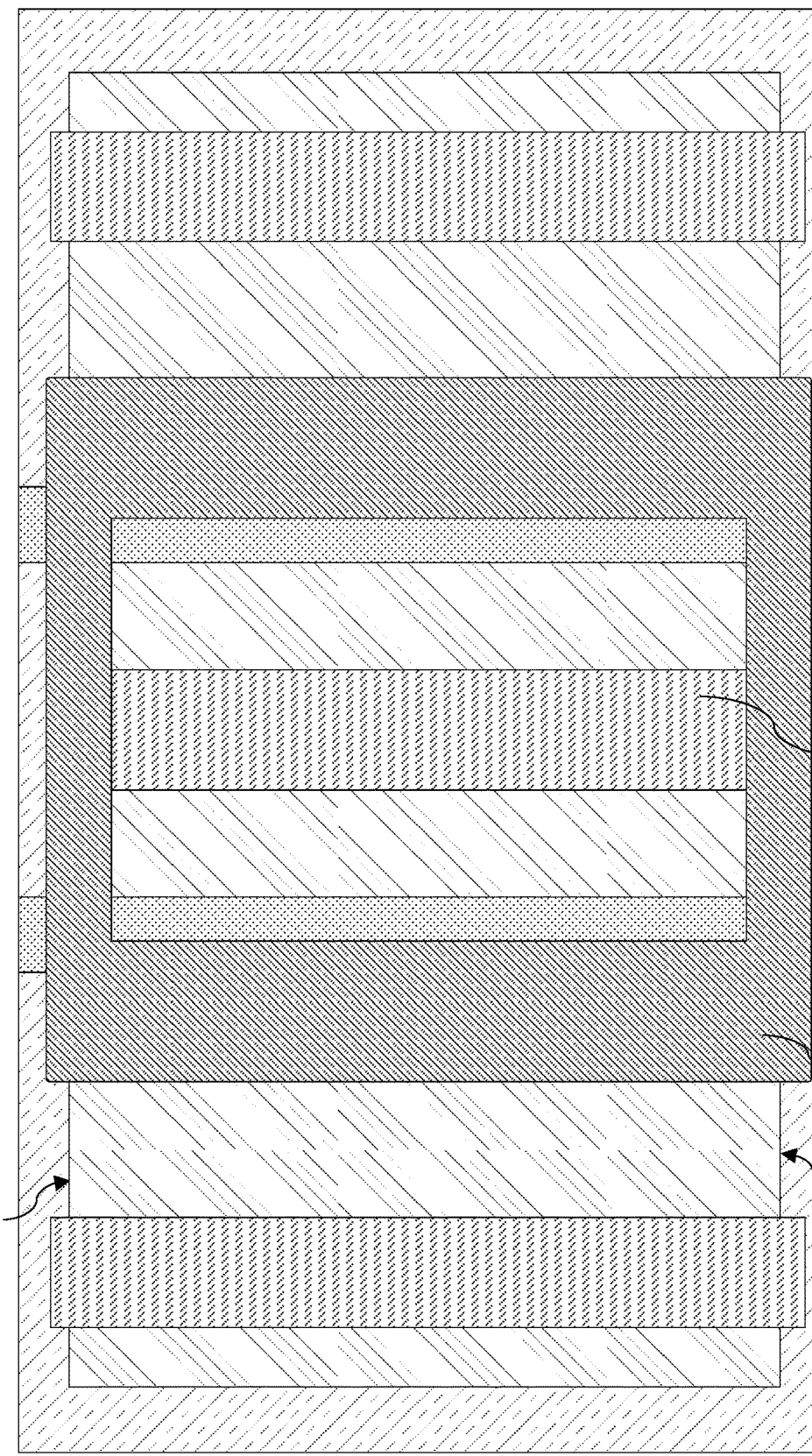

SEMICONDUCTOR DEVICE AND METHOD FOR MANUFACTURING THE SAME

FIELD OF THE INVENTION

The present invention generally relates to a semiconductor device. More specifically, the present invention relates to a high electron mobility transistor (HEMT) semiconductor device having at least one field plate with an aperture to reduce the stress thereof.

BACKGROUND OF THE INVENTION

In recent years, intense research on high-electron-mobility transistors (HEMTs) has been prevalent, particularly for high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HEMT devices, thereby making them suitable for mass production.

SUMMARY OF THE INVENTION

In accordance with one aspect of the present disclosure, a nitride-based semiconductor device is provided. The semiconductor device includes a first nitride-based semiconductor layer, a second nitride-based semiconductor layer, a first source/drain (S/D) electrode, a second S/D electrode, a first gate electrode, a second gate electrode, a first passivation layer, a conductive layer, and a second passivation layer. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The first S/D electrode and the second S/D electrode are disposed above the second nitride-based semiconductor layer. The first gate electrode and the second gate electrode are disposed above the second nitride-based semiconductor layer and between the first and second S/D electrodes. The first passivation layer is disposed on the second nitride-based semiconductor layer and covers the first and second gate electrodes. The conductive layer is disposed over the first passivation layer and includes an electrode portion and a field plate portion. The electrode portion is located between the first and second gate electrodes and makes contact with the second nitride-based semiconductor layer. The field plate portion is located over the first and second gate electrodes and directly connected to the electrode portion. The second passivation layer is disposed on the first passivation layer and the conductive layer and has at least one portion between the electrode portion and the field plate portion of the conductive layer and penetrates the conductive layer to make contact with the first passivation layer.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A gate electrode is formed over the second nitride-based semiconductor layer. A first passivation layer is formed on the second nitride-based semiconductor layer to cover the gate electrode. A blanket conductive layer is formed on the first passivation layer and spanning the gate electrode. The blanket conductive layer is patterned to form a conductive layer comprising a field plate portion and an electrode portion connected to each other and having an opening between the field plate and electrode portions, such that the opening overlaps with a sidewall of the gate electrode.

In accordance with one aspect of the present disclosure, a nitride-based semiconductor device is provided. The semiconductor device includes a first nitride-based semiconductor layer, a second nitride-based semiconductor layer, a first S/D electrode, a second S/D electrode, a first gate electrode, a second gate electrode, a first passivation layer, a third S/D electrode, a field plate, and a second passivation layer. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The first S/D electrode and the second S/D electrode are disposed above the second nitride-based semiconductor layer. The first gate electrode and the second gate electrode are disposed above the second nitride-based semiconductor layer and between the first and second S/D electrodes. The first passivation layer is disposed on the second nitride-based semiconductor layer and covering the first and second gate electrodes. The third S/D electrode is located between the first and second gate electrodes and makes contact with the second nitride-based semiconductor layer. The field plate is located over the first and second gate electrodes and directly connected to the third S/D electrode. The third S/D electrode and the field plate collectively form at least one closed loop opening therebetween. The second passivation layer is disposed on the first passivation layer and covers the field plate and the first, second, and third S/D electrodes. The opening is filled with at least one portion in contact with the first passivation layer.

In accordance with one aspect of the present disclosure, a nitride-based semiconductor device is provided. The semiconductor device includes a first nitride-based semiconductor layer, a second nitride-based semiconductor layer, a first gate electrode, a first S/D electrode, and a first field plate. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The first and second nitride-based semiconductor layers collectively have an active portion and an electrically isolating portion that is non-semi-conducting and surrounds the active portion to form at least two interfaces extending along a first direction and spaced apart from each other by the active portion. The first gate electrode is disposed above the second nitride-based semiconductor layer and extends along a second direction different than the first direction and across the two interfaces such that the first gate electrode extends to the electrically isolating portion.

The first S/D electrode is disposed above the second nitride-based semiconductor layer and parallel with the first gate electrode. The first field plate is disposed above the second nitride-based semiconductor layer and the first gate electrode and extends along the second direction and across the two interfaces such that the field plate extends to the electrically isolating portion, and overlaps with the first gate electrode near the interfaces.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A gate electrode is formed over the second nitride-based semiconductor layer. A field plate is formed above the gate electrode. A mask layer is formed over the field plate and has opposite edges spaced apart from each other by a distance less than a length of the first field plate. An ion implantation process is performed on the second nitride-based semiconductor layer such that the second nitride-based semiconductor layer has an electrically isolating portion exposed from the mask layer.

In accordance with one aspect of the present disclosure, a nitride-based semiconductor device is provided. The semiconductor device includes a first nitride-based semiconductor layer, a second nitride-based semiconductor layer, a gate electrode, and a field plate. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The first and second nitride-based semiconductor layers collectively have an active portion and an electrically isolating portion that is non-semi-conducting and surrounds the active portion to form two interfaces extending a first direction and spaced apart from each other by a distance. A gate electrode is disposed above the second nitride-based semiconductor layer and extends along a second direction different than the first direction and across the two interfaces such that the gate electrode extends to the electrically isolating portion. The field plate is disposed above the second nitride-based semiconductor layer and the gate electrode and extends along the second direction in a length greater than a distance between the two interfaces such that the field plate extends to the electrically isolating portion.

By applying the above configuration, since the area of the field plate portion of the conductive layer is reduced, the accumulation of the stress in the conductive layer can be lowered, thereby improving the reliability of the semiconductor device. The field plate portion of the conductive layer can still be positioned directly above the gate electrode, so the modulation of the electric field distribution of the corresponding source or drain region remains. Moreover, the field plate portion can be formed to cover the gate electrode near the interface between the active portion and the electrically isolating portion, and therefore the gate electrode can be protected from ion bombardment.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2A, FIG. 2B, and FIG. 2C illustrate different stages of a method for manufacturing a semiconductor device according to some embodiments of the present disclosure;

FIG. 8 is a top view of a semiconductor device according to some embodiments of the present disclosure;

DETAILED DESCRIPTION

Figure 1A:
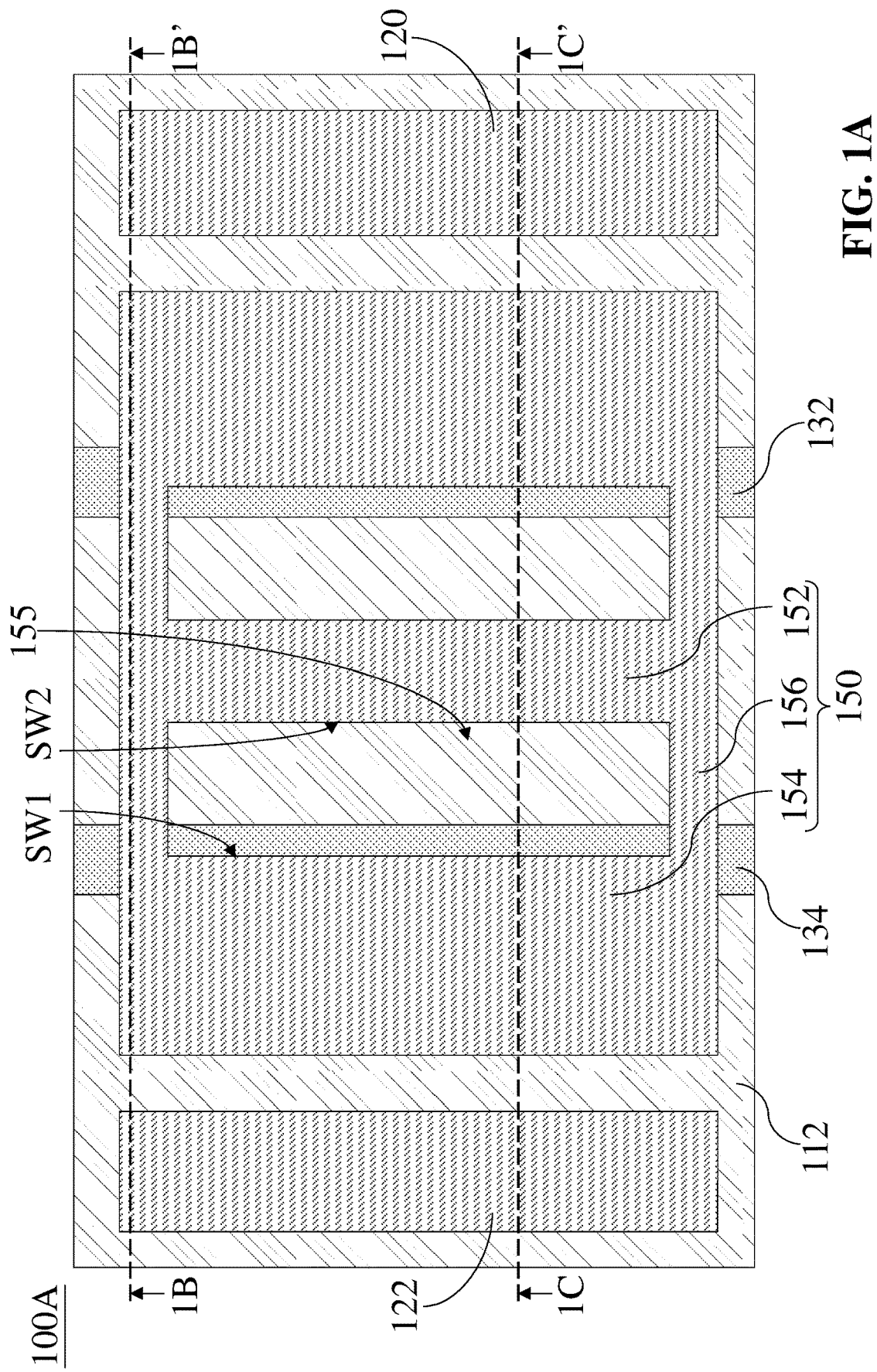
FIG. 1A is a layout of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a layout of a semiconductor device 100A according to some embodiments of the present disclosure. The layout shows a relationship among electrodes 120 and 122, gate electrodes 132 and 136, and a conductive layer 150 over a nitride-based semiconductor layer 112 of the semiconductor device 100A. These elements can constitute parts of transistors in the semiconductor device 100A. The layout reflects a top view of the semiconductor device 100A, which means the layout reflects the electrodes 120 and 122, the gate electrodes 132 and 136, and the conductive layer 150 are formed as layers over the nitride-based semiconductor layer 112 and viewed along a direction normal to these layers. More structural details of the semiconductor device 100A are provided as follows.

Figure 1B:
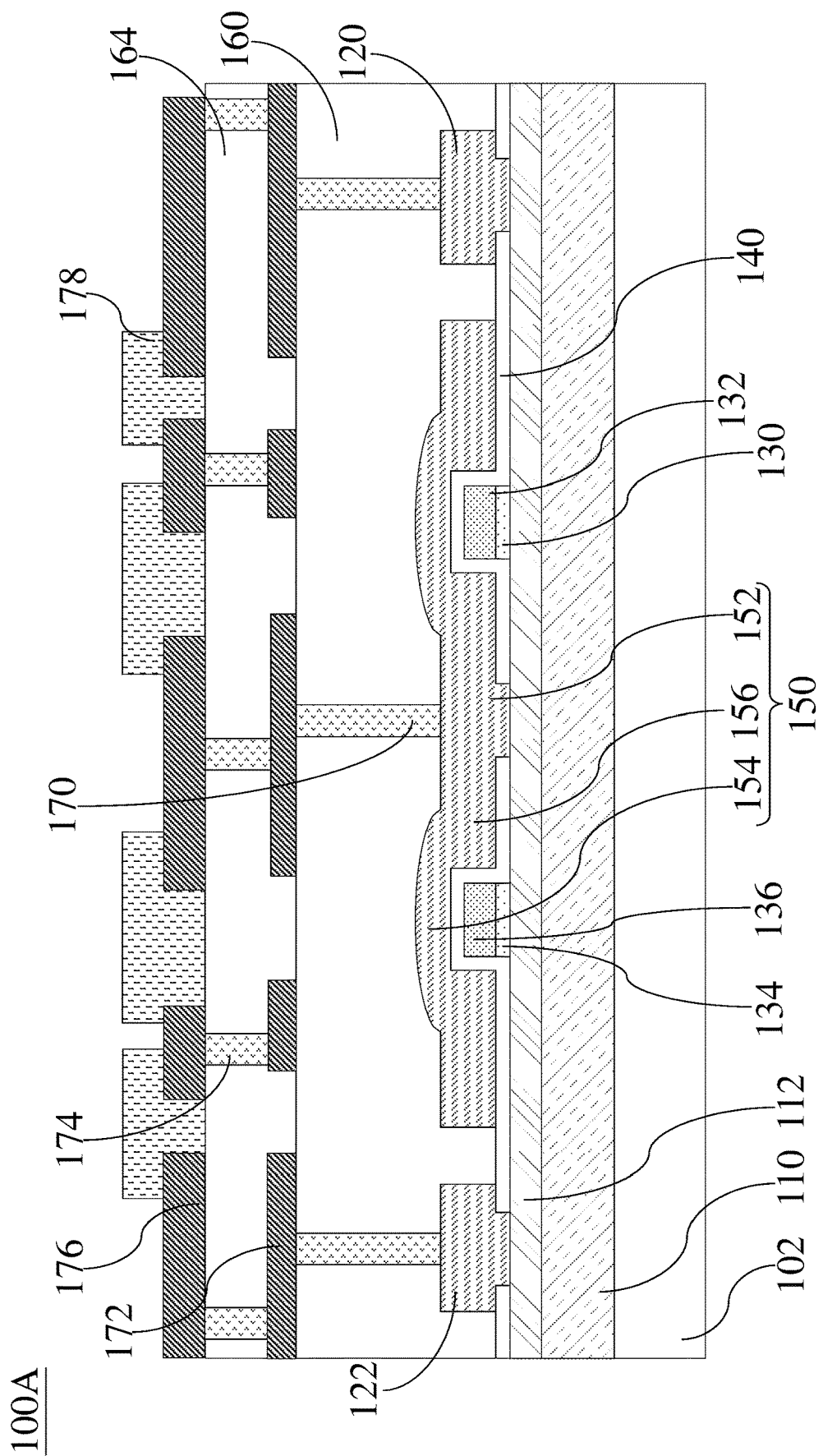
FIG. 1B and FIG. 1C are cross-sectional views across a line 1B-1B' and a line 1C-1C' of the semiconductor device 100A in FIG. 1A.
Figure 1C:
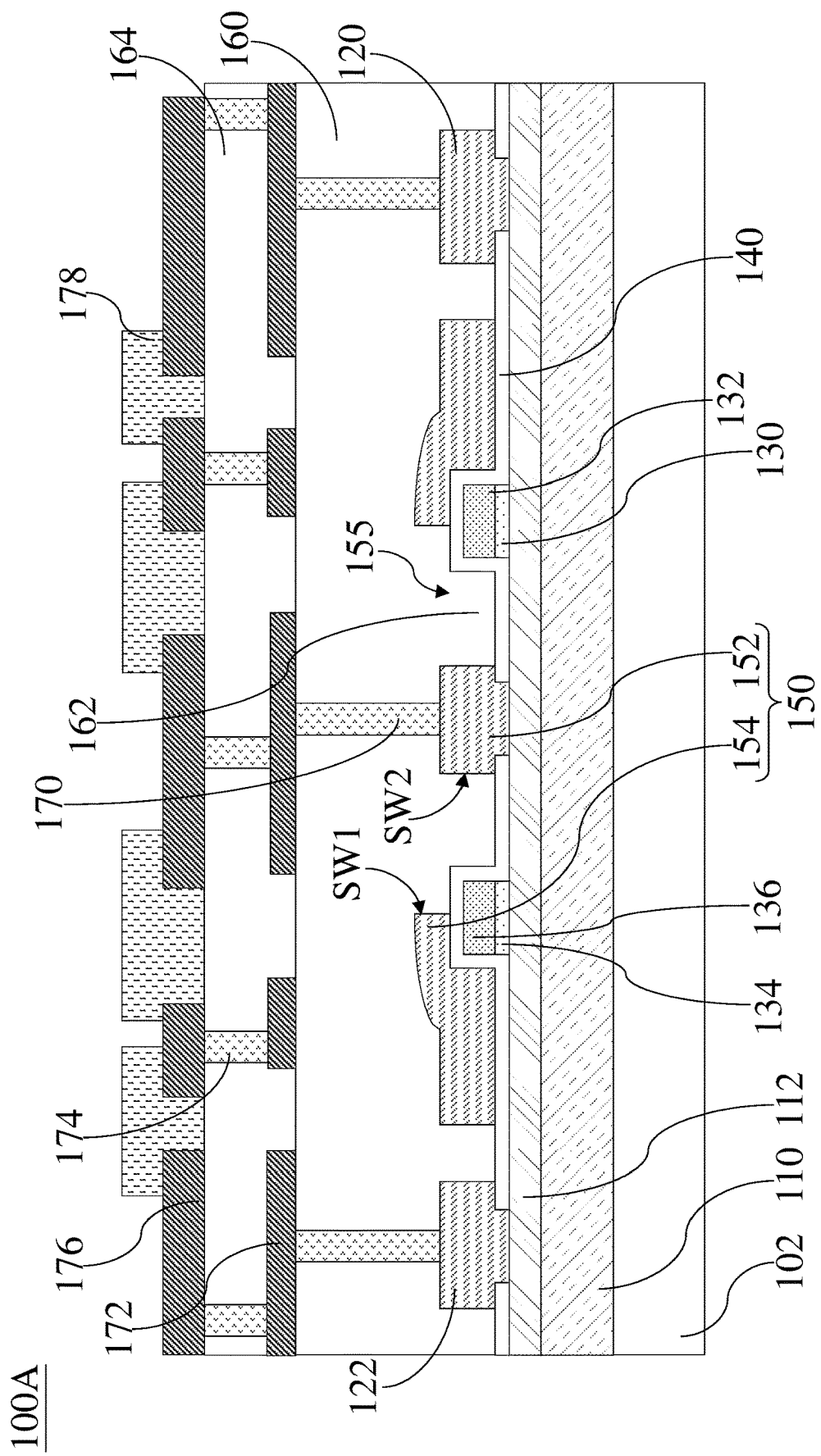

To illustrate, FIG. 1B and FIG. 1C are cross-sectional views across a line 1B-1B' and a line 1C-1C' of the semiconductor device 100A in FIG. 1A. The semiconductor device 100A further includes a substrate 102, a nitride-based semiconductor layer 110, p-type doped III-V compound semiconductor layers 130, 134, passivation layers 140, 160, 164, contact vias 170, 174, patterned conductive layers 172, 176, and a protection layer 178.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The nitride-based semiconductor layer 110 is disposed over the substrate 102. The exemplary materials of the nitride-based semiconductor layer 110 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The nitride-based semiconductor layer 112 is disposed on the nitride-based semiconductor layer 110. The exemplary materials of the nitride-based semiconductor layer 112 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 110 and 112 are selected such that the nitride-based semiconductor layer 112 has a bandgap (i.e., forbidden band width) greater than a bandgap of the nitride-based semiconductor layer 110, which causes electron affinities thereof different from each other and forms a heterojunction therebetween. For example, when the nitride-based semiconductor layer 110 is an undoped GaN layer having a bandgap of approximately 3.4 eV, the nitride-based semiconductor layer 112 can be selected as an AlGaN layer having bandgap of approximately 4.0 eV. As such, the nitride-based semiconductor layers 110 and 112 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the semiconductor device 100A is available to include at least one GaN-based high-electron-mobility transistor (HEMT).

In some embodiments, the semiconductor device 100A may further include a buffer layer, a nucleation layer, or a combination thereof (not illustrated). The buffer layer can be disposed between the substrate 102 and the nitride-based semiconductor layer 110. The buffer layer can be configured to reduce lattice and thermal mismatches between the substrate 102 and the nitride-based semiconductor layer 110, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof. The nucleation layer may be formed between the substrate 102 and the buffer layer. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The p-type doped III-V compound semiconductor layers 130 and 134 and the gate electrodes 132 and 136 are stacked on the nitride-based semiconductor layer 112. The p-type doped III-V compound semiconductor layer 130 is between the nitride-based semiconductor layer 112 and the gate electrode 132. The p-type doped III-V compound semiconductor layer 134 is between the nitride-based semiconductor layer 112 and the gate electrode 136. In some embodiments, the semiconductor device 100A may further include an optional dielectric layer (not illustrated) between the p-type doped III-V compound semiconductor layers 130 and 134 and the gate electrodes 132 and 136.

In the exemplary illustration of FIGS. 1B and 1C, the semiconductor device 100A is an enhancement mode device, which is in a normally-off state when the gate electrodes 132 and 136 are at approximately zero bias. Specifically, the p-type doped III-V compound semiconductor layers 130 and 134 may create at least one p-n junction with the nitride-based semiconductor layer 112 to deplete the 2DEG region, such that at least one zone of the 2DEG region corresponding to a position below the corresponding p-type doped III-V compound semiconductor layer 130 or 134 has different characteristics (e.g., different electron concentrations) than the rest of the 2DEG region and thus is blocked. Due to such mechanism, the semiconductor device 100A has a normally-off characteristic. In other words, when no voltage is applied to the gate electrodes 132 and 136 or a voltage applied to the gate electrodes 132 and 136 is less than a threshold voltage (i.e., a minimum voltage required to form an inversion layer below the gate electrodes 132 and 136), the zone of the 2DEG region below the p-type doped III-V compound semiconductor layer 130 or 134 is kept blocked, and thus no current flows therethrough. Moreover, by providing the p-type doped III-V compound semiconductor layers 130 and 134, gate leakage current is reduced and an increase in the threshold voltage during the off-state is achieved.

In some embodiments, the p-type doped III-V compound semiconductor layers 130 and 134 can be omitted, such that the semiconductor device 100A is a depletion-mode device, which means the semiconductor device 100A in a normally-on state at zero gate-source voltage.

The exemplary materials of the p-type doped III-V compound semiconductor layers 130 and 134 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg. In some embodiments, the nitride-based semiconductor layer 110 includes undoped GaN and the nitride-based semiconductor layer 112 includes AlGaN, and the p-type doped III-V compound semiconductor layers 112 are p-type GaN layers which can bend the underlying band structure upwards and to deplete the corresponding zone of the 2DEG region, so as to place the semiconductor device 100A into an off-state condition. In some embodiments, the gate electrodes 132 and 136 may include metals or metal compounds. The gate electrodes 132 and 136 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 132 and 136 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a SiOx layer, a SiNx layer, a high-k dielectric material (e.g., HfO2, Al2O3, TiO2, HfZrO, Ta2O3, HfSiO4, ZrO2, ZrSiO2, etc), or combinations thereof.

The passivation layer 140 is disposed over the nitride-based semiconductor layer 112. The passivation layer 140 can be formed for a protection purpose or for enhancing the electrical properties of the device (e.g., by providing an electrically isolation effect between/among different layers/elements). The passivation layer 140 covers a top surface of the nitride-based semiconductor layer 112. The passivation layer 140 covers the p-type doped III-V compound semiconductor layers 130 and 134. The passivation layer 140 covers the gate electrodes 132 and 136. The exemplary materials of the passivation layer 140 can include, for example but are not limited to, SiNx, SiOx, Si3N4, SiON, SiC, SiBN, SiCBN, oxides, nitrides, plasma-enhanced oxide (PEOX), tetraethoxysilane normal abbreviation (TEOS), or combinations thereof. In some embodiments, the passivation layer 140 can be a multi-layered structure, such as a composite dielectric layer of Al2O3/SiN, Al2O3/SiO2, AlN/SiN, AlN/SiO2, or combinations thereof.

In some embodiments, the electrode 120 can serve as a source electrode. In some embodiments, the electrode 120 can serve as a drain electrode. In some embodiments, the electrode 122 can serve as a source electrode. In some embodiments, the electrode 122 can serve as a drain electrode. In some embodiments, each of the electrodes 120 and 122 can be called a source/drain (S/D) electrode, which means they can serve as a source electrode or a drain electrode, depending on the device design.

The electrodes 120 and 122 are disposed on/over/above the nitride-based semiconductor layer 112. The electrodes 120 and 122 can be located at two opposite sides of the gate electrodes 132 and 136 although other configurations may be used, particularly when plural source, drain, or gate electrodes are employed in the device. The gate electrodes 132 and 136 are located between the electrodes 120 and 122. In the exemplary illustration of FIG. 1B and FIG. 1C, the electrodes 120 and 122 are symmetrical about the gate electrodes 132 and 136 therebetween. In some embodiments, the electrodes 120 and 122 can be optionally asymmetrical about the gate electrodes 132 and 136 therebetween. That is, one of the electrodes 120 and 122 may be closer to a middle position of the gate electrodes 132 and 136 than another one of the electrodes 120 and 122. The electrodes 120 and 122 can penetrate/pass through the passivation layer 140 to contact the nitride-based semiconductor layer 112.

In some embodiments, the electrodes 120 and 122 can include, for example but are not limited to, metals, alloys, doped semiconductor materials (such as doped crystalline silicon), compounds such as silicides and nitrides, other conductor materials, or combinations thereof. The exemplary materials of the electrodes 120 and 122 can include, for example but are not limited to, Ti, AlSi, TiN, or combinations thereof. The electrodes 120 and 122 may be a single layer, or plural layers of the same or different composition. In some embodiments, the electrodes 120 and 122 form ohmic contact with the nitride-based semiconductor layer 112. The ohmic contact can be achieved by applying Ti, Al, or other suitable materials to the electrodes 120 and 122. In some embodiments, each of the electrodes 120 and 122 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The conductive layer 150 is disposed over the nitride-based semiconductor layer 112 and the passivation layer 140. The conductive layer 150 includes an electrode portion 152 and a field plate portion 154. The electrode portion 152 is directly connected to the field plate portion 154. The electrode portion 152 is located between the gate electrodes 132 and 136. The electrode portion 152 can penetrate/pass through the passivation layer 140 to make contact with the nitride-based semiconductor layer 112. The gate electrodes 132 and 136, the electrodes 120 and 122, and the electrode portion 152 of the conductive layer 150 can collectively act as at least one nitride-based/GaN-based HEMT with the 2DEG region, which can be called a nitride-based/GaN-based semiconductor device.

In the exemplary illustration of FIG. 1B and FIG. 1C, the gate electrodes 132 and 136 are symmetrical about the electrode portion 152 of the conductive layer 150 therebetween. In some embodiments, the gate electrodes 132 and 136 can be optionally asymmetrical about the electrode portion 152 of the conductive layer 150 therebetween. That is, one of the gate electrodes 132 and 136 may be closer to the electrode portion 152 of the conductive layer 150 than another one of the gate electrodes 132 and 136.

The field plate portion 154 of the conductive layer 150 is located over the gate electrodes 132 and 136. The field plate portion 154 of the conductive layer 150 can change an electric field distribution of source or drain regions and affect breakdown voltage of the semiconductor device 100A. In other words, the field plate portion 154 can suppress the electric field distribution in desired regions and to reduce its peak value.

The electrode portion 152 and the field plate portion 154 are arranged to directly connect to each other such that the manufacturing process of the semiconductor device 100A can be simplified. For example, the electrode portion 152 and the field plate portion 154 can be formed from the same single conductive layer so the number of the stages of the manufacturing process of the semiconductor device 100A decreases.

However, since such a single conductive layer may have large area during a manufacturing stage of a semiconductor device, it would result in a significant stress which induces cracks at underlying element layers or peeling. The cracks as such will negatively affect the electrical properties and reliability of the device. Accordingly, an oversized area issue may occur at such a single conductive layer.

With respect to the oversized area issue, the conductive layer 150 can be designed as a discontinuous conductive layer for the purpose of avoiding accumulation of stress. Such a configuration can alleviate the afore-mentioned negative effects due to stress. Herein, the phrase "discontinuous conductive layer" means that, the conductive layer 150 can have at least one aperture/opening such that the conductive layer 150 has at least one inner boundary/border between the two opposite edges thereof in at least one vertical cross-sectional view of the conductive layer 150 (e.g., as shown in FIG. 1C).

More specifically, as shown in FIG. 1A, the conductive layer 150 can have at least one aperture/opening 155. As compared with a continuous conductive layer, the area of the conductive layer 150 can be reduced by creating the apertures/openings 155. As such, the accumulation of the stress in the conductive layer 150 can be lowered, thereby improving the reliability of the semiconductor device 100A.

With creating the apertures/openings 155, the conductive layer 150 can at least have inner sidewalls SW1 and SW2. The locations of the inner sidewalls SW1 and SW2 depend on the locations of the apertures/openings 155. For example, the apertures/openings 155 are located directly over at least one of the gate electrodes 132 and 134, which results in that the inner sidewalls SW1 can be located directly over at least one of the gate electrodes 132 and 134. The electrode portion 152 is formed with the inner sidewall SW2. The field plate portion 154 is formed with the inner sidewall SW1. The inner sidewalls SW2 and SW1 of the electrode and field plate portions 152 and 154 can face each other.

The inner sidewalls SW1 and SW2 of the conductive layer 150 can form a closed loop inner boundary for the conductive layer 150. Accordingly, each of the apertures/openings 155 can serve a closed loop pattern collectively formed by the inner sidewalls SW1 and SW2 of the conductive layer 150. The closed loop apertures/openings 155 can overlap with the gate electrodes 132 and 136 from the top view of the semiconductor device 100A. The electrode portion 152 and the field plate portion 154 are spaced apart from the closed loop inner boundary. The conductive layer 150 can further include at least one connection portion 156 connecting the electrode and field plate portions 152 and 154. The connection portions 156 are located between the electrode and field plate portions 152 and 154. The connection portions 156 are located at edges of the electrode and field plate portions 152 and 154. With the connection portions 156, the electrode and field plate portions 152 and 154 can have substantially the same electric potential when a voltage is applied to the conductive layer 150.

With respective the gate electrode 132, a vertical projection of at least one portion of a right edge of the gate electrode 132 on the nitride-based semiconductor layer 112 is out of a vertical projection of the conductive layer 150 on the nitride-based semiconductor layer 112. A right sidewall of the gate electrode 132 is located between the inner sidewall SW1 of the field plate portion 154 and the sidewall SW2 of the electrode portion 152, at least from a top view thereof.

With respective the gate electrode 136, a vertical projection of at least one portion of a right edge of the gate electrode 136 on the nitride-based semiconductor layer 112 is out of a vertical projection of the conductive layer 150 on the nitride-based semiconductor layer 112. A right sidewall of the gate electrode 136 is located between the inner sidewall SW1 of the field plate portion 154 and the sidewall SW2 of the electrode portion 152, at least from a top view thereof.

For each of the gate electrodes 132 and 136, still one edge thereof near the electrode 120 or 122 is covered by the field plate portion 154 of the conductive layer 150. The reason is to change the electric field distribution of the corresponding source or drain region. Therefore, lowering the accumulation of the stress in the conductive layer 150 with the modulation to the electric field distribution remained is achieved.

Each of the apertures/openings 155 can be formed in a shape of a rectangle. The electrode portion 152 and the field plate portion 154 can be regarded as a plurality of strips of the conductive layer 150 parallel with each other. The strips of the conductive layer 150 are parallel with the gate electrodes 132 and 134. The strips of the conductive layer 150 are parallel with the electrodes 120 and 122.

Moreover, as shown in FIG. 1C, the inner sidewall SW1 of the field plate portion 154 extends upward at a position directly above the gate electrode 132 or 136. The sidewall SW2 of the electrode portion 152 is spaced apart from the gate electrode 132 or 136. Therefore, the edge of the gate electrode 132 or 136 facing the electrode 120 or 122 is located directly beneath the field plate portion 154 of the conductive layer 150. Such a configuration is to keep the modulation of the electric field distribution of the corresponding source or drain region.

The exemplary materials of the source and the conductive layer 150 can include, for example but are not limited to, metals, alloys, doped semiconductor materials (such as doped crystalline silicon), other suitable conductor materials, or combinations thereof. In some embodiments, the exemplary materials of the conductive layer 150 can include, for example but are not limited to, conductive materials, such as Ti, Ta, TiN, TaN, or combinations thereof. In some embodiments, the conductive layer 150 and the electrodes include the same material.

The passivation layer 160 is disposed on the passivation layer 140 and the conductive layer 150. The passivation layer 160 covers the electrodes 120 and 122 and the conductive layer 150. Since the conductive layer 150 is formed to have the apertures/openings 155, the passivation layer 160 can have at least one portion 162 penetrating the conductive layer 150 to make contact with the passivation layer 140. The portion 162 of the passivation layer 160 is located within the apertures/openings 155. The portion 162 of the passivation layer 160 is located between the electrode portion 152 and the field plate portion 154 of the conductive layer 150. In some embodiment, the portion 162 of the passivation layer 160 is entirely enclosed/surrounded by the conductive layer 150. In some embodiment, the portion 162 of the passivation layer 160 is entirely enclosed/surrounded by the electrode portion 152, the field plate portion 154, and the connection portions 156 of the conductive layer 150. In some embodiments, each of the apertures/openings 155 is filled with the corresponding portion 162. By the configuration, the conductive layer 150 can be positioned firmly to avoid peeling from the passivation layer 140.

The passivation layer 160 can serve as a planarization layer which has a level top surface to support other layers/elements. In some embodiments, the passivation layer 160 can be formed as being thicker, and a planarization process, such as chemical mechanical polish (CMP) process, is performed on the passivation layer 160 to remove the excess portions, thereby forming a level top surface. The exemplary materials of the passivation layer 160 can include, for example but are not limited to, $SiN_x$, $SiO_x$, $Si_3N4$, SiON, SiC, SiBN, SiCBN, oxides, PEOX, TEOS, or combinations thereof. In some embodiments, the passivation layer 160 is a multi-layered structure, such as a composite dielectric layer of $Al_2O_3$/SiN, $Al_2O_3$/$SiO_2$, AlN/SiN, AlN/$SiO_2$, or combinations thereof.

The contact vias 170 are disposed within the passivation layer 160. The contact vias 170 penetrate the passivation layer 160. The contact vias 170 can extend longitudinally to at least electrically couple with the electrodes 120 and 122 and the electrode portion 152 and the field plate 154 of the conductive layer 150. At least one of the contact vias 170 can be formed to make contact with the electrode portion 152 of the conductive layer 150 and this is electrically couple with the field plate 154 through the connection portion 156. At least one of the contact vias 170 can form an interface with the electrode portion 152, which is higher than a bottom of the inner sidewall SW1 of the field plate portion 154 and is lower than a top of the inner sidewall SW1 of the field plate portion 154. The exemplary materials of the contact vias 170 can include, for example but are not limited to, conductive materials, such as metals or alloys.

The patterned conductive layer 172 is disposed on the passivation layer 160 and the contact vias 170. The patterned conductive layer 172 is in contact with the contact vias 170. The patterned conductive layer 172 may have metal lines, pads, traces, or combinations thereof, such that the patterned conductive layer 172 can form at least one circuit. The exemplary materials of the patterned conductive layer 172 can include, for example but are not limited to, conductive materials. The patterned conductive layer 172 may include a single film or multilayered film having Ag, Al, Cu, Mo, Ni, Ti, alloys thereof, oxides thereof, nitrides thereof, or combinations thereof.

The passivation layer 164 is disposed above the passivation layer 130 and the patterned conductive layer 172. The passivation layer 164 covers the passivation layer 160 and the patterned conductive layer 172. The exemplary materials of the passivation layer 164 can include, for example but are not limited to, $SiN_x$, $SiO_x$, $Si_3N_4$, SiON, SiC, SiBN, SiCBN, oxides, PEOX, or combinations thereof. In some embodiments, the passivation layer 164 is a multi-layered structure, such as a composite dielectric layer of $Al_2O_3$/SiN, $Al_2O_3$/$SiO_2$, AlN/SiN, AlN/$SiO_2$, or combinations thereof.

The contact vias 174 are disposed within the passivation layer 164. The contact vias 174 penetrate the passivation layer 164. The contact vias 174 can extend longitudinally to at least electrically couple with the patterned conductive layer 172. The exemplary materials of the contact vias 174 can include, for example but are not limited to, conductive materials, such as metals or alloys.

The patterned conductive layer 176 is disposed on the passivation layer 164 and the contact vias 174. The patterned conductive layer 176 is in contact with the contact vias 174. The patterned conductive layer 176 may have metal lines, pads, traces, or combinations thereof, such that the patterned conductive layer 176 can form at least one circuit. The exemplary materials of the patterned conductive layer 176 can include, for example but are not limited to, conductive materials. The patterned conductive layer 176 may include a single film or multilayered film having Ag, Al, Cu, Mo, Ni, Ti, alloys thereof, oxides thereof, nitrides thereof, or combinations thereof.

The protection layer 178 is disposed above the passivation layer 164 and the patterned conductive layer 176. The protection layer 178 covers the passivation layer 164 and the patterned conductive layer 176. The protection layer 178 can prevent the patterned conductive layer 176 from oxidizing. Some portions of the patterned conductive layer 176 can be exposed through openings in the protection layer 178, which are configured to electrically connect to external elements (e.g., an external circuit).

Figure 2C:
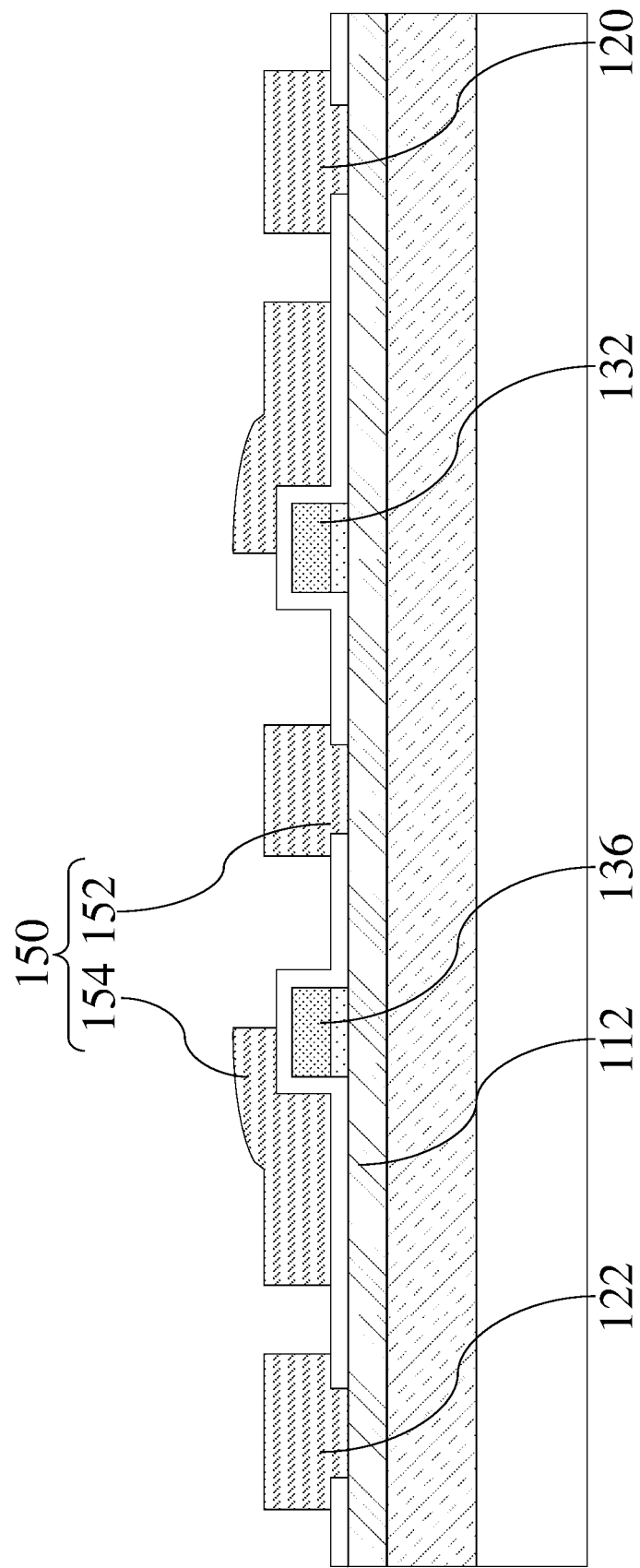

Different stages of a method for manufacturing the semiconductor device 100A are shown in FIG. 2A, FIG. 2B, and FIG. 2C, described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Referring to FIG. 2A, a substrate 102 is provided. Nitride-based semiconductor layers 110 and 112 can be formed over the substrate 102 in sequence by using the above-mentioned deposition techniques. P-type doped III-V compound semiconductor layers 130 and 134 and gate electrodes 132 and 136 can be formed above the nitride-based semiconductor layer 112 in sequence by using the deposition techniques and a series of patterning process. In some embodiments, the patterning process can include photolithography, exposure and development, etching, other suitable processes, or combinations thereof. A passivation layer 140 is formed to cover the p-type doped III-V compound semiconductor layers 130 and 134 and the gate electrodes 132 and 136. A portion of the passivation layer 140 can be removed to expose the nitride-based semiconductor layer 112.

Referring to FIG. 2B, a blanket conductive layer 150' is formed on the passivation layer 140. The blanket conductive layer 150' can span the gate electrodes 132 and 136. The blanket conductive layer 150' can be formed to make contact with the exposed portions of the nitride-based semiconductor layer 112.

Referring to FIG. 2C, the blanket conductive layer 150' is patterned to form a conductive layer 150. The conductive layer 150 includes an electrode portion 152 and a field plate portion 154 connected to each other, as afore-mentioned. The conductive layer 150 is patterned to have at least one aperture/opening 155 between the electrode and field plate portions 152 and 154. The apertures/openings 155 can overlap with a sidewall of the gate electrodes 132 and 136, such that the gate electrodes 132 and 136 at least have portions free from coverage of the conductive layer 150. Moreover, electrodes 120 and 122 can be formed by patterning the blanket conductive layer 150' as well. The formed electrodes 120 and 122 are in contact with the nitride-based semiconductor layer 112 and are separated from the conductive layer 150. In some embodiments, patterning the blanket conductive layer 150 can include a dry etching process, which is advantageous to apply to a thick layer such as the blanket conductive layer 150.

Figure 3A:
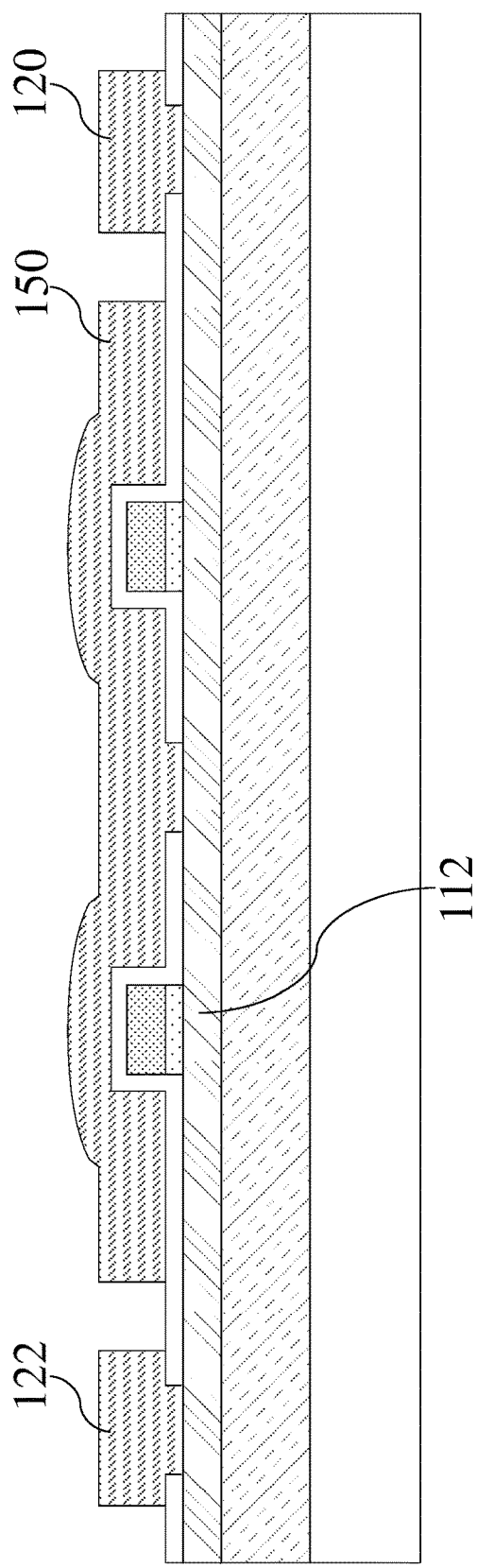
FIG. 3A and FIG. 3B illustrate different stages of a method for manufacturing a semiconductor device according to some embodiments of the present disclosure.
Figure 3B:
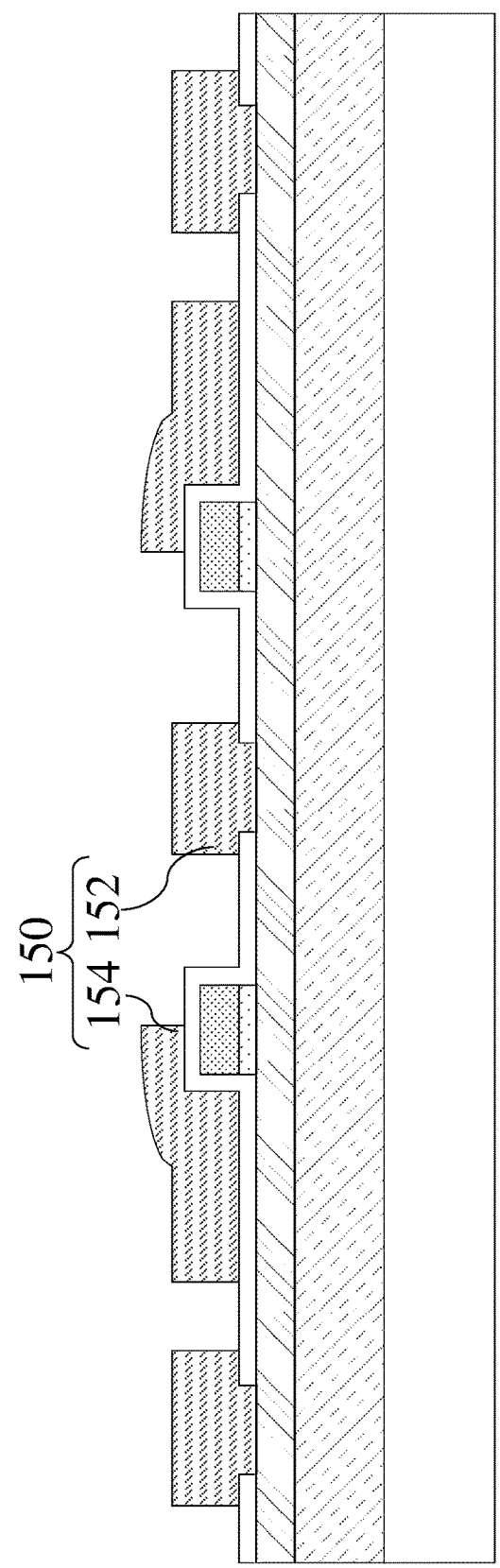

In some embodiments, patterning the blanket conductive layer 150' can be performed twice. As shown in FIG. 3A, patterning the blanket conductive layer 150' can be performed to form electrodes 120 and 122 contact with the nitride-based semiconductor layer 112 and separated from the conductive layer 150. At this stage, the conductive layer 150 is a solid layer without any aperture/opening. Thereafter, as shown in FIG. 3B, the conductive layer 150 is patterned to form an electrode portion 152 and a field plate portion 154 connected to each other, as afore-mentioned.

Such a manner can improve the accuracy of formed position of the aperture/opening of the conductive layer 150.

Figure 4:
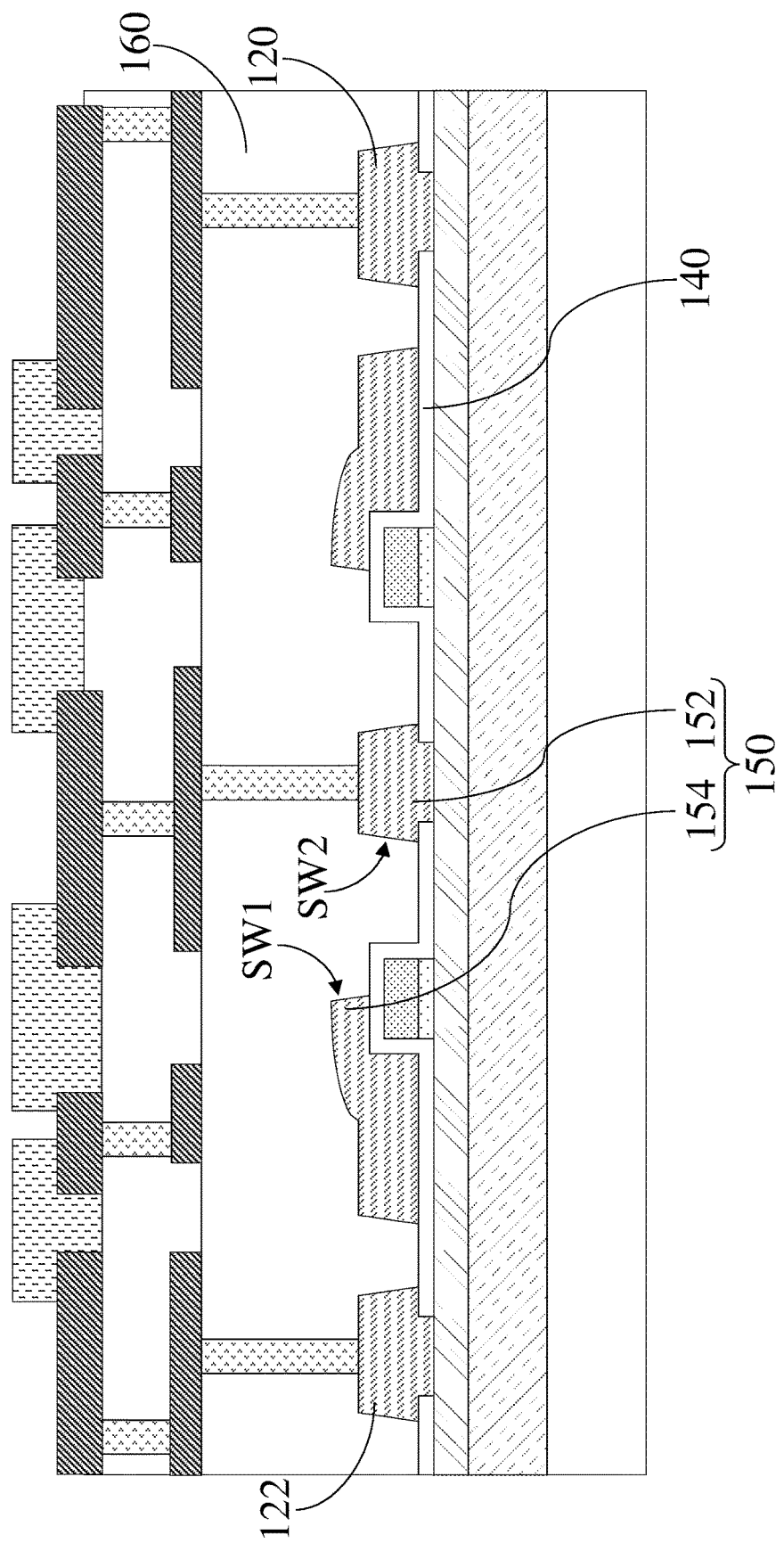
FIG. 4 is a cross-sectional view of a semiconductor device according to some embodiments of the present disclosure.

FIG. 4 is a cross-sectional view of a semiconductor device 100B according to some embodiments of the present disclosure. In the present embodiment, as shown in the exemplary illustration of FIG. 4, the conductive layer 150 has oblique sidewalls. More specifically, the electrode portion 152 and the field plate portion 154 respectively have inner sidewalls SW1 and SW2 facing each other. The inner sidewalls SW1 and SW2 of the electrode portion 152 and the field plate portion 154 tilt in opposite directions. The profile of the inner sidewalls SW1 and SW2 can be achieved by turning the process parameters. The oblique inner sidewalls SW1 and SW2 can receive more force components from the passivation layer 160, which will be advantageous to be positioned firmly and avoid peeling from the passivation layer 140. Furthermore, the electrodes 120 and 122 can have oblique sidewalls.

Figure 5:
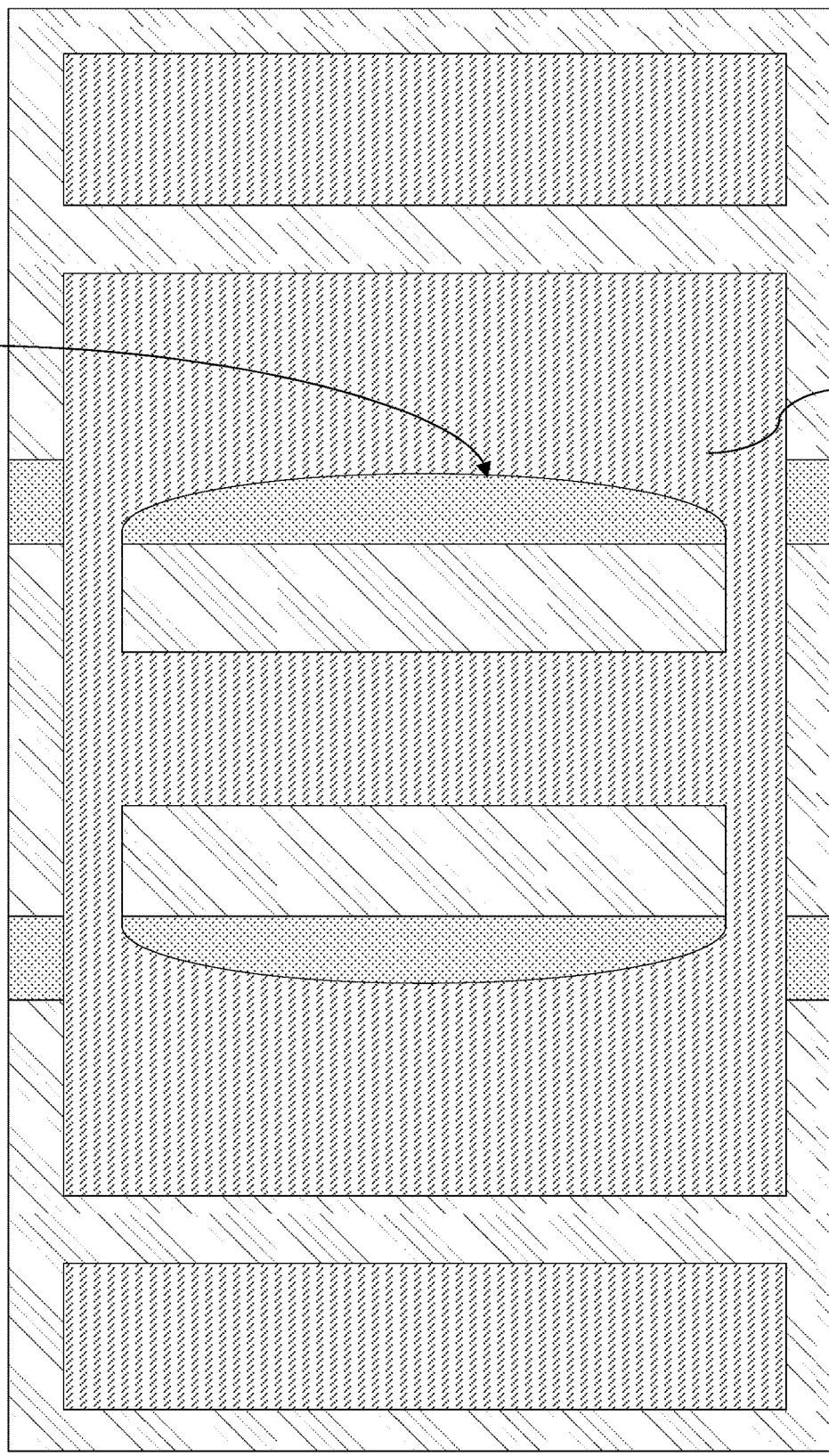
FIG. 5 is a cross-sectional view of a semiconductor device according to some embodiments of the present disclosure.

FIG. 5 is a cross-sectional view of a semiconductor device 100C according to some embodiments of the present disclosure. In the present embodiment, as shown in the exemplary illustration of FIG. 5, each of the closed loop apertures/openings 155 of the conductive layer 150 has a curved boundary. Since the closed loop apertures/openings 155 can receive a portion of a passivation layer (e.g., the passivation layer 160 of FIG. 1B), the curved boundary thereof can be advantageous to disperse the stress from the passivation layer.

The above embodiments are provided with respect to the pattern of the conductive layer, and the described manner can be further applied to make the semiconductor device performance improved.

Figure 6A:
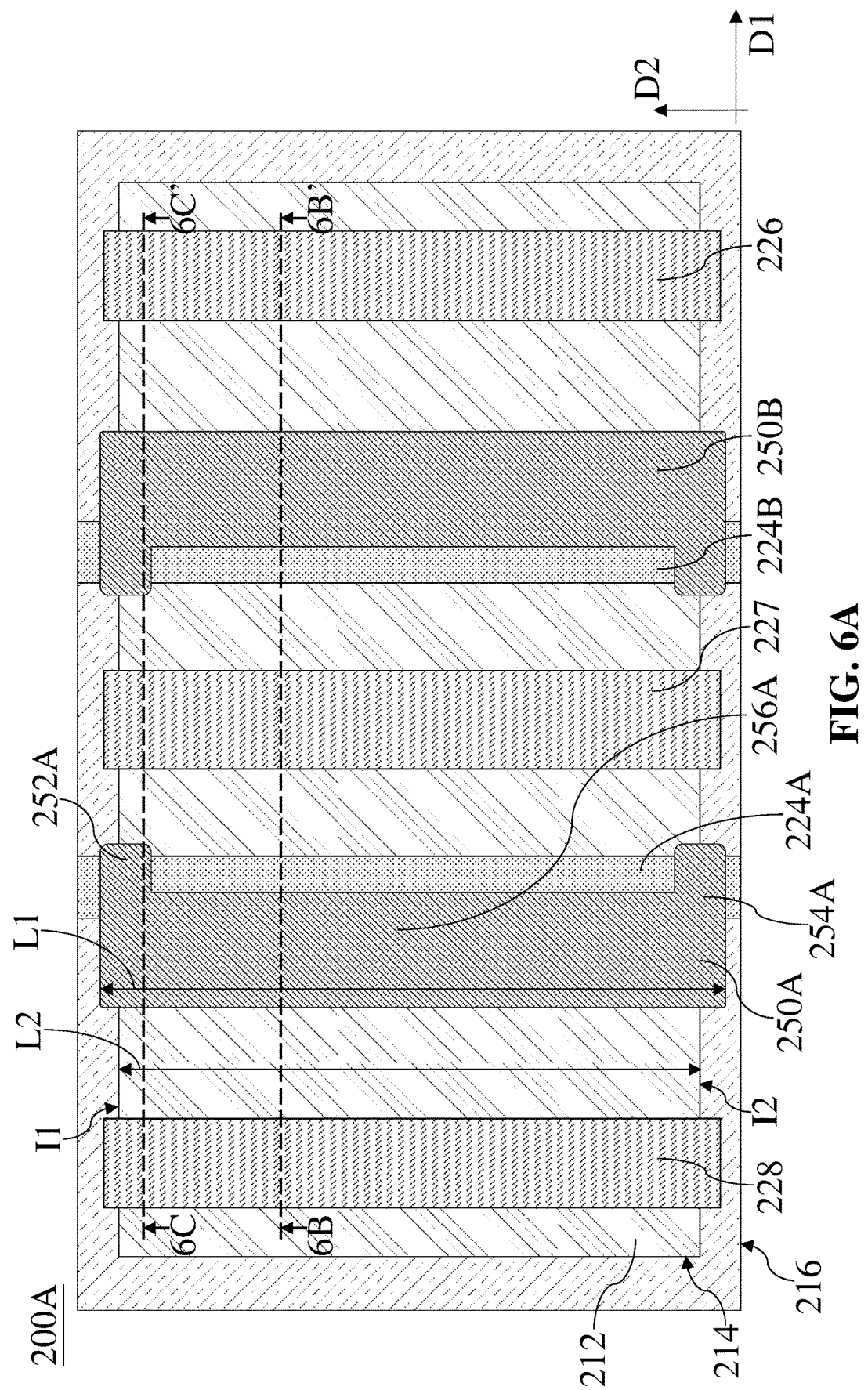
FIG. 6A is a top view of a semiconductor device according to some embodiments of the present disclosure.

FIG. 6A is a top view of a semiconductor device 200A according to some embodiments of the present disclosure. In order to make the description clear, directions D1 and D2 are labeled in FIG. 6A, which are different than each other. For example, the direction D1 is perpendicular to the direction D2.

The layout shows a relationship among electrodes 226, 227, and 228, gate electrodes 224A and 224B, and field plates 250A and 250B disposed over a nitride-based semiconductor layer 212 of the semiconductor device 200A. These elements can constitute parts of transistors in the semiconductor device 200A. The layout reflects a top view of the semiconductor device 200A, which means the layout reflects the electrodes 226, 227, and 228, gate electrodes 224A and 224B, and field plates 250A and 250B are formed as layers over the nitride-based semiconductor layer 212 and viewed along a direction normal to these layers. More structural details of the semiconductor device 200A are provided as follows.

Figure 6B:
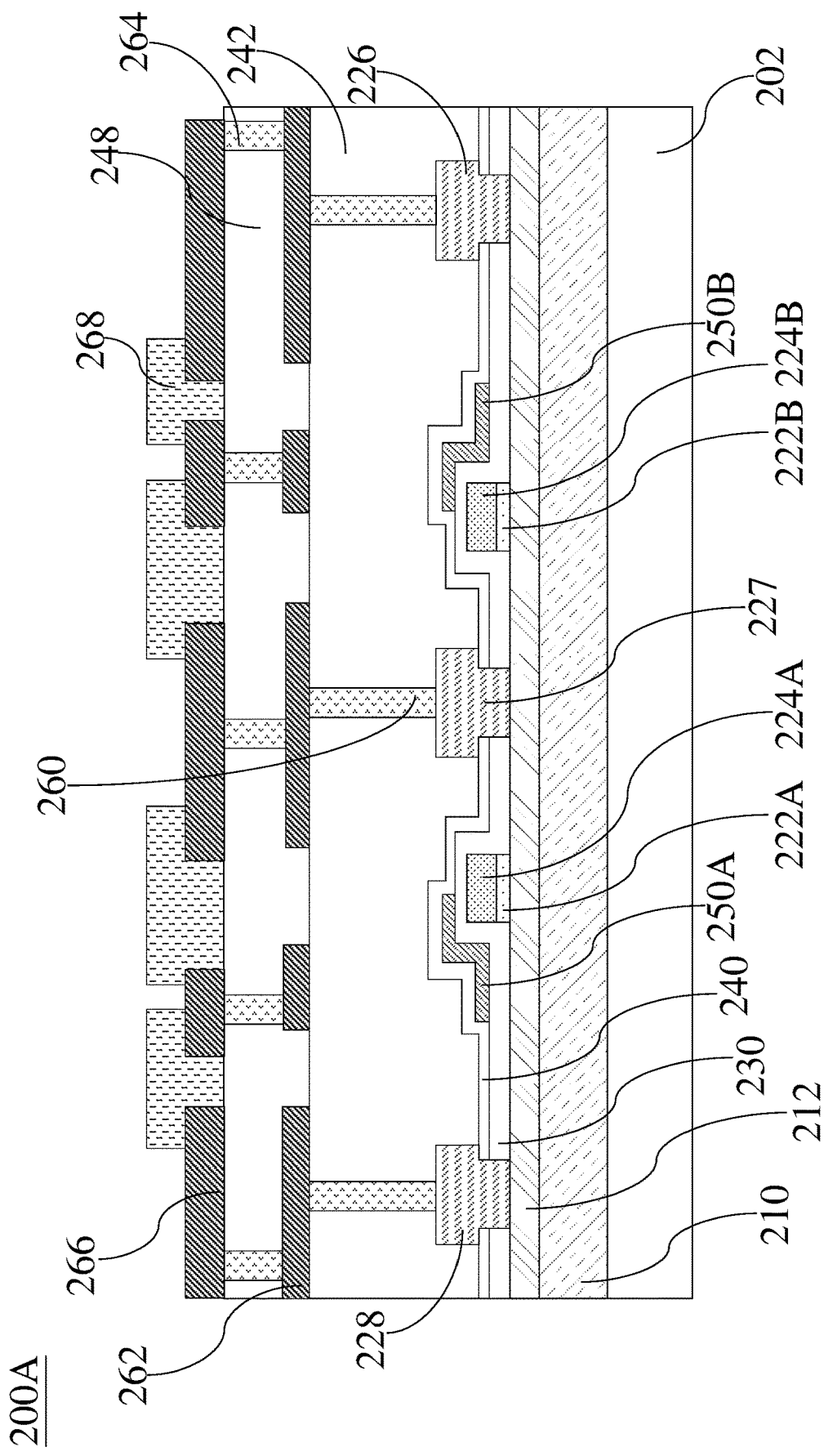
FIG. 6B and FIG. 6C are cross-sectional views across a line 6B-6B' and a line 6C-6C' of the semiconductor device in FIG. 6A.
Figure 6C:
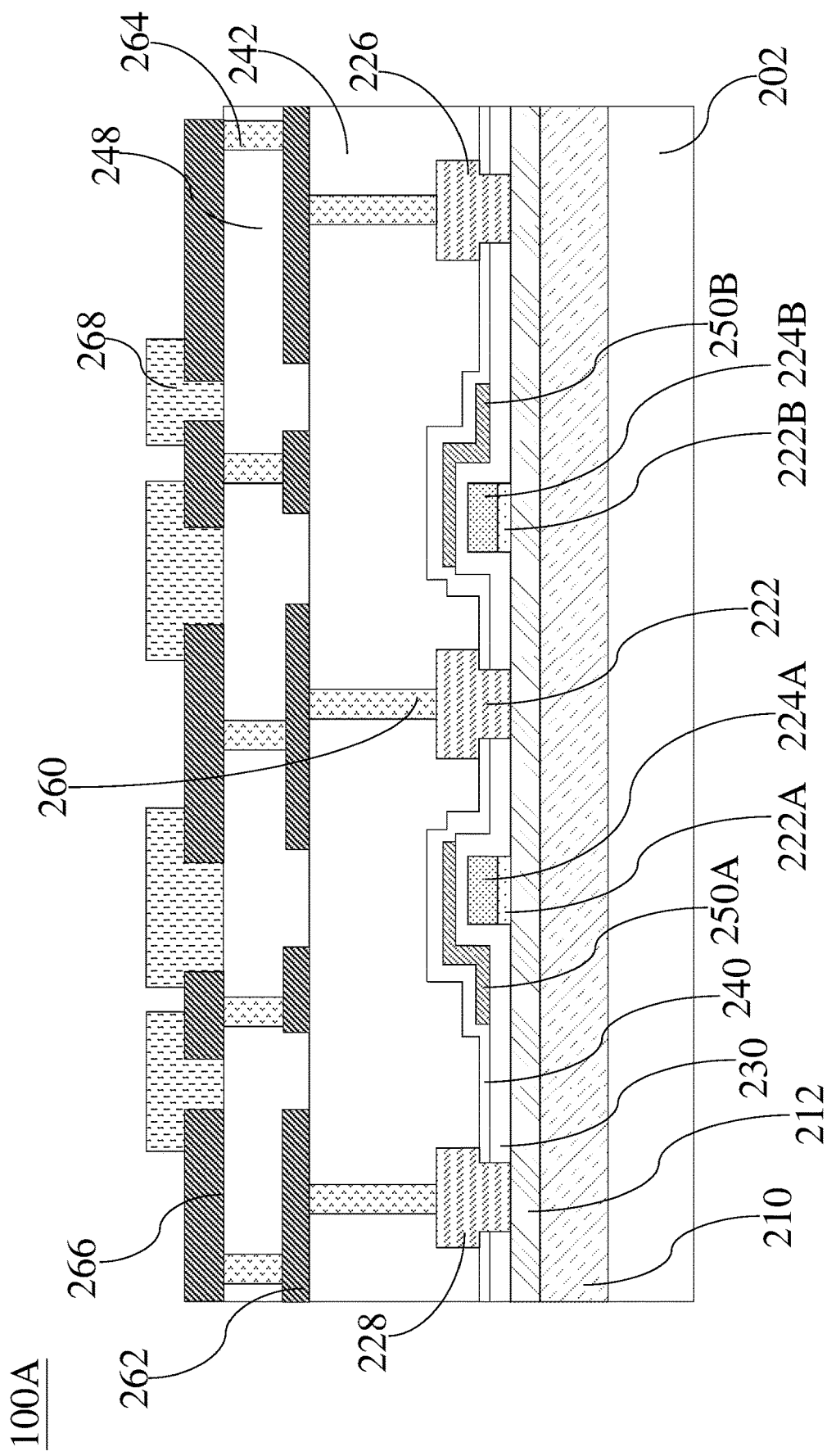

To illustrate, FIG. 6B and FIG. 6C are cross-sectional views across a line 6B-6B' and a line 6C-6C' of the semiconductor device 200A in FIG. 6A. The semiconductor device 200A further includes a substrate 202, a nitride-based semiconductor layer 210, p-type doped III-V compound semiconductor layers 222A, 222B, passivation layers 230, 240, 242, 248, contact vias 260, 264, patterned conductive layers 262, 266, and a protection layer 268.

The substrate 202 can applies the configuration identical with or similar to that of the substrate 102 as afore-mentioned.

The nitride-based semiconductor layers 210 and 212 can applies the configuration identical with or similar to that of the substrate 102 as afore-mentioned. The nitride-based semiconductor layers 210 and 212 can collectively have an active portion 114 and an electrically isolating portion 116, as shown in FIG. 6A. The electrically isolating portion 216 is non-semi-conducting. Herein, the term "non-semi-conducting" means the electrically isolating portion 216 can still provide an electrical isolation property even it is biased. The electrically isolating portion 216 can enclose/surround the active portion. The active portion 214 and the electrically isolating portion 216 form two interfaces I1 and I2. The two interfaces I1 and I2 extend along the direction D1. The two interfaces I1 and I2 are opposite and thus spaced apart from each other by the active portion 214.

In some embodiments, the electrically isolating portion 216 of the nitride-based semiconductor layers 210 and 212 can be doped with ions to achieve the electrically isolating purpose. The ions can include, for example but are not limited to, nitrogen ion, fluorine ion, oxygen ion, argon atom, aluminum atom, or combinations thereof. These dopants can make the electrically isolating portion 216 have a high resistivity and thus act as an electrically isolating region. The active portion 214 and the electrically isolating portion 216 are configured to define a device boundary. Accordingly, the semiconductor device 100A is available to include at least one GaN-based HEMT located within the active portion 214 and surrounded by the electrically isolating portion 216.

The p-type doped III-V compound semiconductor layers 222A, 222B are disposed above the nitride-based semiconductor layer 212. The p-type doped III-V compound semiconductor layers 222A, 222B are located within the active portion 214. The p-type doped III-V compound semiconductor layers 222A, 222B extend along the direction D2. The p-type doped III-V compound semiconductor layers 222A, 222B are configured to bring the semiconductor device 200A into an enhancement mode, as afore-mentioned.

The gate electrodes 224A and 224B are disposed above the nitride-based semiconductor layer 212. The gate electrodes 224A and 224B are disposed above the p-type doped III-V compound semiconductor layers 222A, 222B. The gate electrodes 224A and 224B are located within the active portion 214. The gate electrodes 224A and 224B extend along the direction D2. The gate electrodes 224A and 224B extend across the interfaces I1 and I2 such that the gate electrodes 224A and 224B can extend to the electrically isolating portion 216.

The electrodes 226, 227, and 228 are disposed above the nitride-based semiconductor layer 212. The electrodes 226, 227, and 228 are located within the active portion 214. The electrodes 226, 227, and 228 extend along the direction D2. The electrodes 226, 227, and 228 are arranged to be parallel with the gate electrodes 224A and 224B. Each of the electrodes 226, 227, and 228 can serve as a source electrode or a drain electrode, depending on the device design. In some embodiments, at least one of the 226, 227, and 228 can serve as a source electrode. In some embodiments, at least one of the 226, 227, and 228 can serve as a drain electrode.

The relationship among the electrodes 226, 227, and 228 and the gate electrodes 224A and 224B disposed over the nitride-based semiconductor layer 212 can applies the relationship identical with or similar to that of embodiments as afore-mentioned. The gate electrodes 224A and 224B and the electrodes 226, 227, and 228 can collectively act as at least one nitride-based/GaN-based HEMT with the 2DEG region, which can be called a nitride-based/GaN-based semiconductor device.

The field plates 250A and 250B are disposed above the nitride-based semiconductor layer 212. The field plates 250A and 250B are disposed gate electrodes 224A and 224B. The field plates 250A and 250B extends along the direction D2. The field plates 250A and 250B extend across the interfaces I1 and I2 such that the field plates 250A and 250B extend to the electrically isolating portion 216. The field plates 250A and 250B can overlap with the gate electrodes 224A and 224B near the interfaces I1 and I2. More specifically, the gate electrodes 224A and 224B and the field plates 250A and 250B can horizontally overlap with the interfaces I1 and I2. Herein, the "horizontally overlapping" means that: the interface I1 or I2 can go through the gate electrodes 224A and 224B and the field plates 250A and 250 along a horizontal direction in the layout of the semiconductor device 200A (e.g., the direction D1 in FIG. 6A). In some embodiments, the overlapped areas among the gate electrodes 224A and 224B, the field plates 250A and 250, and the interfaces I1 and I2 extend along the direction D1. As such, the gate electrode 224A has portions near and across the interfaces I1 and I2 is covered with the field plate 250A. The gate electrode 224B has portions near and across the interfaces I1 and I2 is covered with the field plate 250B.

Such a configuration is to protect those portions of the gate electrodes 224A and 224B from damage. The reason is that the formation of the electrically isolating portion 216 involves an ion implantation process, which might damage those portions of the gate electrodes 224A and 224B. Specifically, during the ion implantation process, a photoresist layer is formed to cover the gate electrodes 224A and 224B. The photoresist layer has an edge/a boundary to define the area of the active portion 214. Due to process variation, the edge/boundary of the photoresist layer may have the non-uniform thickness which may let the portions of the gate electrodes 224A and 224B damaged by ion bombardment. Once the portions of the gate electrodes 224A and 224B are damaged, at least one leakage current flow would tend to occur at there, reducing the performance of the semiconductor device 100A.

Therefore, since the portions of the gate electrodes 224A and 224B near and across the interfaces I1 and I2 are covered with the field plates 250A and 250B, the field plates 250A and 250B can protect the gate electrodes 224A and 224B from damage of ion bombardment. Accordingly, the occurrence of the leakage current is avoided, improving the performance of the semiconductor device 100A.

To further protect the gate electrodes 224A and 224B, the field plates 250A and 250B extend to the electrically isolating portion 216. In this regard, each of the field plates 250A and 250B has two opposite end portions to achieve it. For example, the field plate 250A has two opposite end portions 252A and 254A. The end portions 252A and 254A are directly over the gate electrode 224A. The end portions 252A and 254A can overlap with the electrically isolating portion 216, such that the end portions 252A and 254A are spaced apart by a distance L1 greater than a distance L2 from the interface I1 to the interface I2. The interfaces I1 and I2 are located between two opposite side surfaces of the field plate 250A.

The profile of the field plates 250A and 250B still can keep the modulation to the electric field distribution. For example, the field plate 250A has a central portion 256A. The central portion 256A is located between the end portions 252A and 254A. The central portion 256A is located within the active portion 214. The central portion 256A of the field plate 250A vertically overlaps with the gate electrode 224A. Herein, the "vertically overlapping" means that: the central portion 256A of the field plate 250A is located directly above the gate electrode 224A. The coverage of the central portion 256A can provide the gate electrode 224A with the modulation to the electric field distribution.

Moreover, the gate electrode 224A has a portion within the active portion 214 and is free from coverage of the central portion 256A of the field plate 250A. The end portions 252A and 254A can be wider than the central portion 256A. Since the central portion 256A is narrower than the end portions 252A and 254A, the end portions 252A and 254A can be regarded as extending along the direction D1 with respect to the central portion 256A. The profile of the field plate 250A can decrease the area of the field plate 250A so as to lower the accumulation of the stress in the field plate 250A as afore-described.

In some embodiments, the central portion 256A of the field plate 250A covers one of the two edges of the gate electrode 224A, and each of the end portions 252A and 254A covers both of the two edges of the gate electrode 224A. With the configuration, three technical effects are achieved, including, the protection of the ion bombardment, the modulation to the electric field distribution, and the lowering accumulation of the stress in the field plate.

The field plate 250B can apply a profile/configuration the same as the field plate 250A, so the relationship between the gate electrode 224B and the field plate 250B can be identical with or similar to the relationship between the gate electrode 224A and the field plate 250A. In some embodiments, the field plates 250A and 250B are symmetrical. For example, the field plates 250A and 250B can be symmetrical about the electrode 227.

Different stages of a method for manufacturing the semiconductor device 200A are shown in FIG. 7A, FIG. 7B, FIG. 7C, FIG. 7D, FIG. 7E, and FIG. 7F, described below.

Figure 7A:
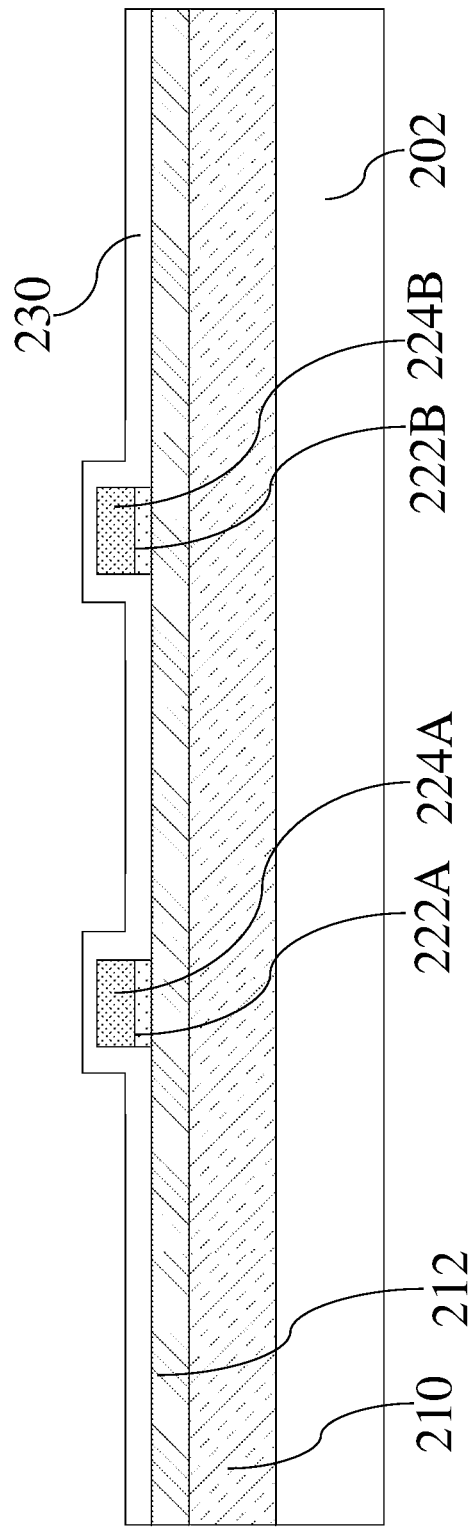
FIG. 7A, FIG. 7B, FIG. 7C, FIG. 7D, FIG. 7E, and FIG. 7F illustrate different stages of a method for manufacturing a semiconductor device according to some embodiments of the present disclosure.

Referring to FIG. 7A, a substrate 202 is provided. Nitride-based semiconductor layers 210 and 212 can be formed over the substrate 202 in sequence by using the above-mentioned deposition techniques. P-type doped III-V compound semiconductor layers 222A and 222B and gate electrodes 224A and 224B can be formed above the nitride-based semiconductor layer 212 in sequence by using the deposition techniques and a series of patterning process. A passivation layer 230 is formed to cover the p-type doped III-V compound semiconductor layers 222A and 222B and the gate electrodes 224A and 224B.

Figure 7B:
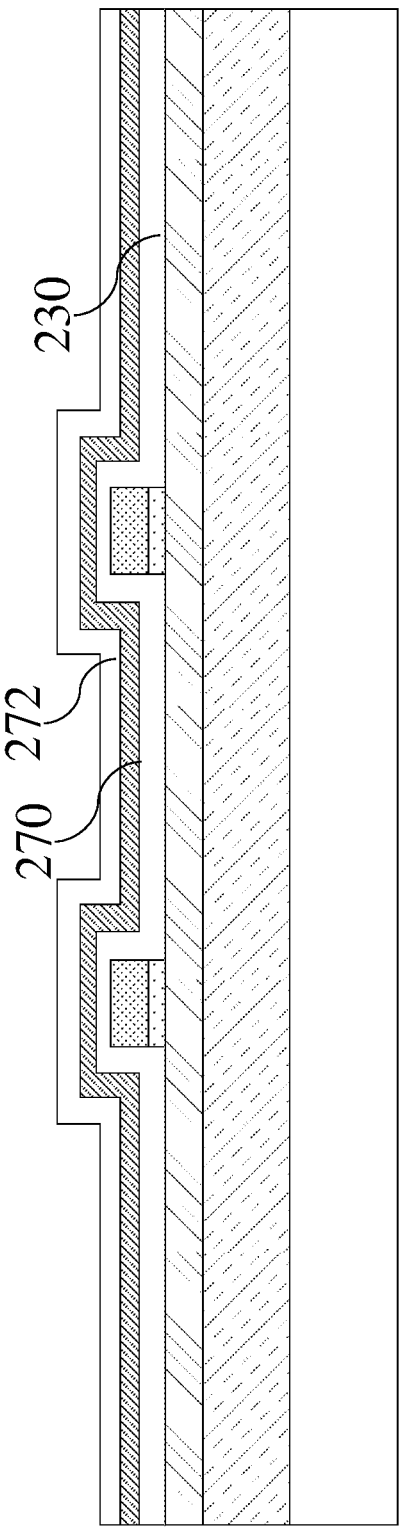

Referring to FIG. 7B, a blanket conductive layer 270 is formed over the passivation layer 230. A mask layer 272 is formed over the blanket conductive layer 270. A patterning process can be performed on the blanket conductive layer 270 using the mask layer 272.

Figure 7C:
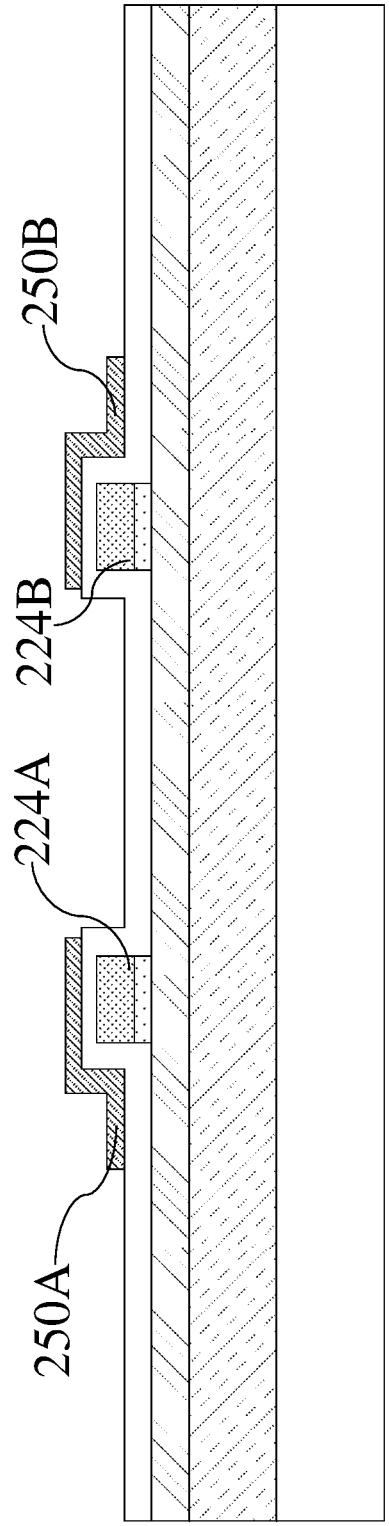

Referring to FIG. 7C, the blanket conductive layer 270 is patterned to form field plates 250A and 250B above the gate electrodes 224A and 224B. As afore-described, the formed field plates 250A and 250B can span the gate electrodes 224A and 224B, respectively, so as to protect the gate electrodes 224A and 224B from ion bombardment. Thereafter, the mask layer 272 is removed.

Figure 7D:
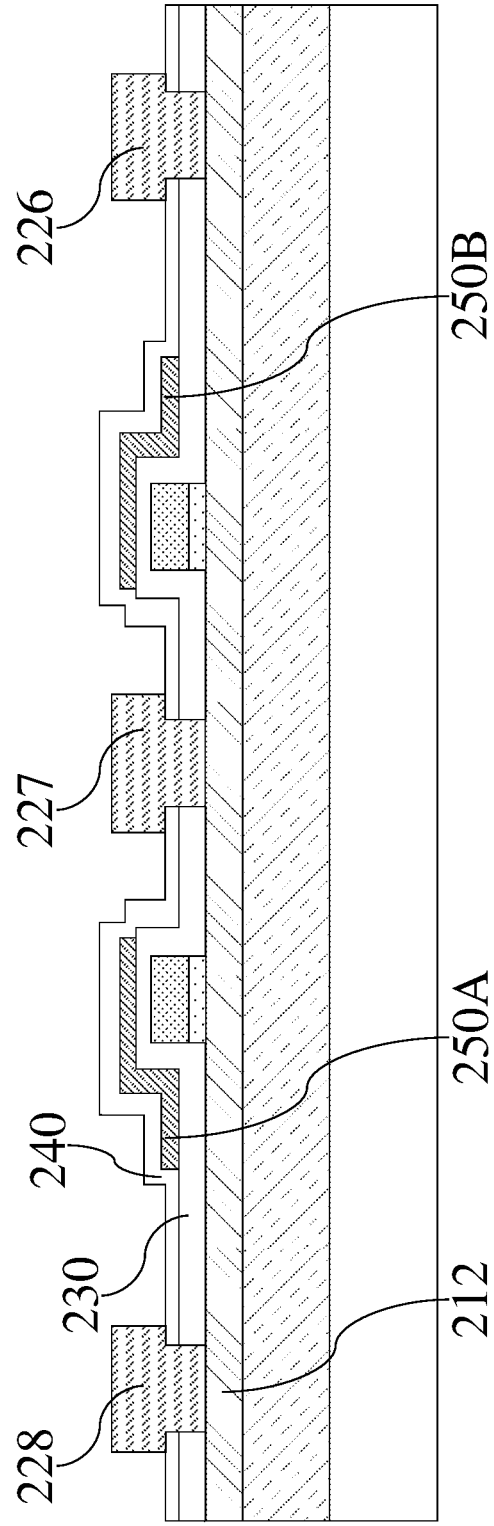

Referring to FIG. 7D, a passivation layer 240 is formed to cover the field plates 250A and 250B and the passivation layer 230. Portions of the passivation layers 230 and 240 can be removed to expose the nitride-based semiconductor layer 212. Thereafter, electrodes 226, 227, and 228 can be formed from a blanket conductive layer by using the deposition techniques and a series of patterning process.

Figure 7E:
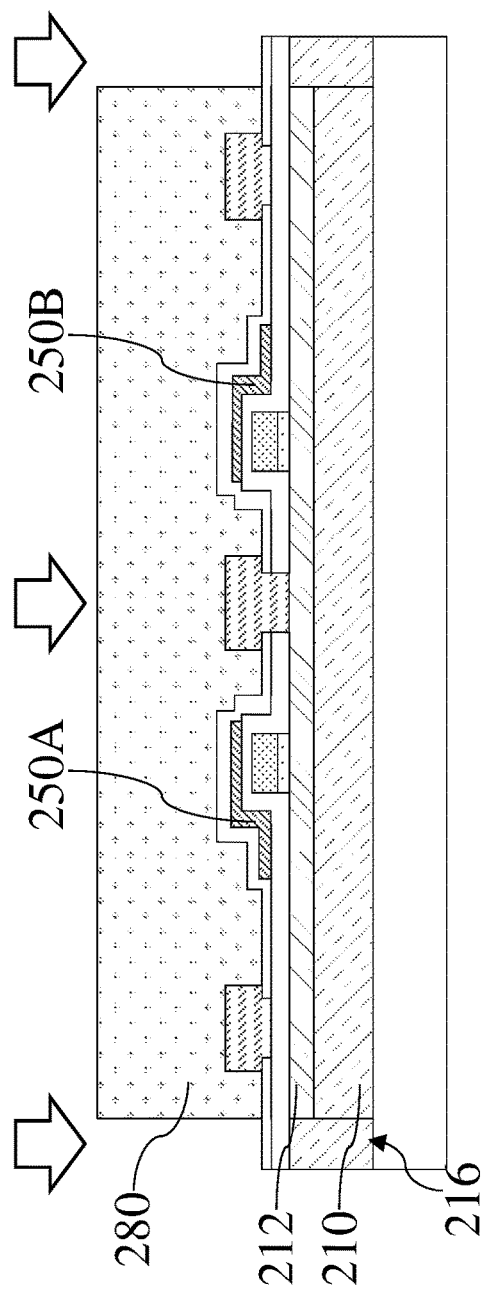
Figure 7F:
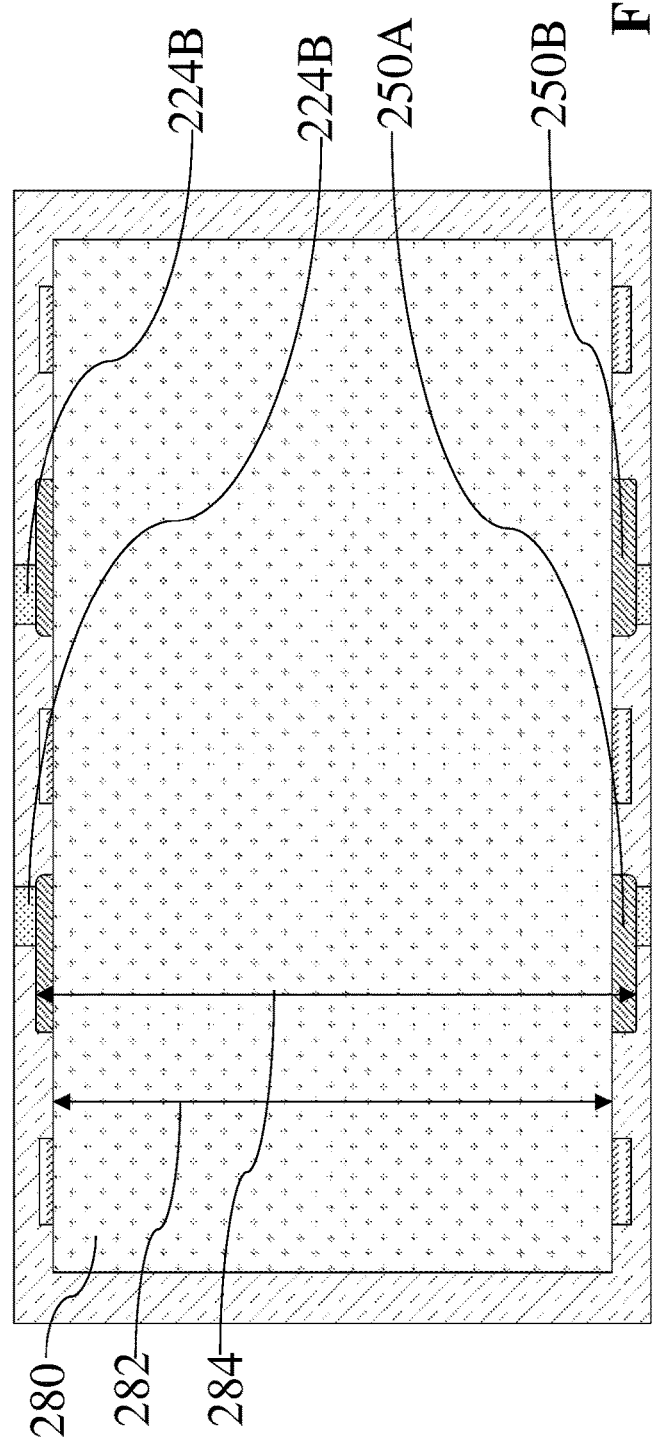

Referring to FIG. 7E and FIG. 7F, in which FIG. 7F is a top view corresponding to FIG. 7E, a mask layer 280 is formed over the field plates 250A and 250B. The mask layer 280 has opposite edges spaced apart from each other by a distance 282 less than a length 284 of each of the field plates 250A and 250B. In this regard, the distance 282 and the length 284 are in a direction that the gate electrodes 224A and 224B extend along the same. Accordingly, there would be some of the nitride-based semiconductor layers 210 and 212 free from coverage of the mask layer 280. After the formation of the mask layer 280, an ion implantation process is performed on the nitride-based semiconductor layers 210 and 212 such that the nitride-based semiconductor layers 210 and 212 collectively have an electrically isolating portion 216 exposed from the mask layer 280. As afore-described, even though the mask layer 280 may have the non-uniform thickness at the edges due to the process variation, the field plate 250A and 250B can protect gate electrodes 224A and 224B from unexpected damage of the ion bombardment.

FIG. 8 is a top view of a semiconductor device 200B according to some embodiments of the present disclosure. In the present embodiment, as shown in the exemplary illustration of FIG. 8, a field plate 290 is formed to replace the field plates 250A and 250B. The field plate 290 is formed to have a ring shape by patterning a blanket conductive layer. The field plate 290 and the gate electrode 224A and 224B horizontally overlap with the interfaces I1 and I2 for the purpose of protection of ion bombardment.

Since the field plate 290 is ring-shaped, some of the gate electrode 224A and 224B are exposed. The electrode 227 has a portion free from coverage from the first field plate. The portion of the electrode 227 is enclosed/surrounded by the ring shape of the field plate 290. With this configuration, the field plate 290 can still provide the modulation to the electric field distribution with the area thereof reduced, so as to lower accumulation of the stress therein.

Figure 9A:
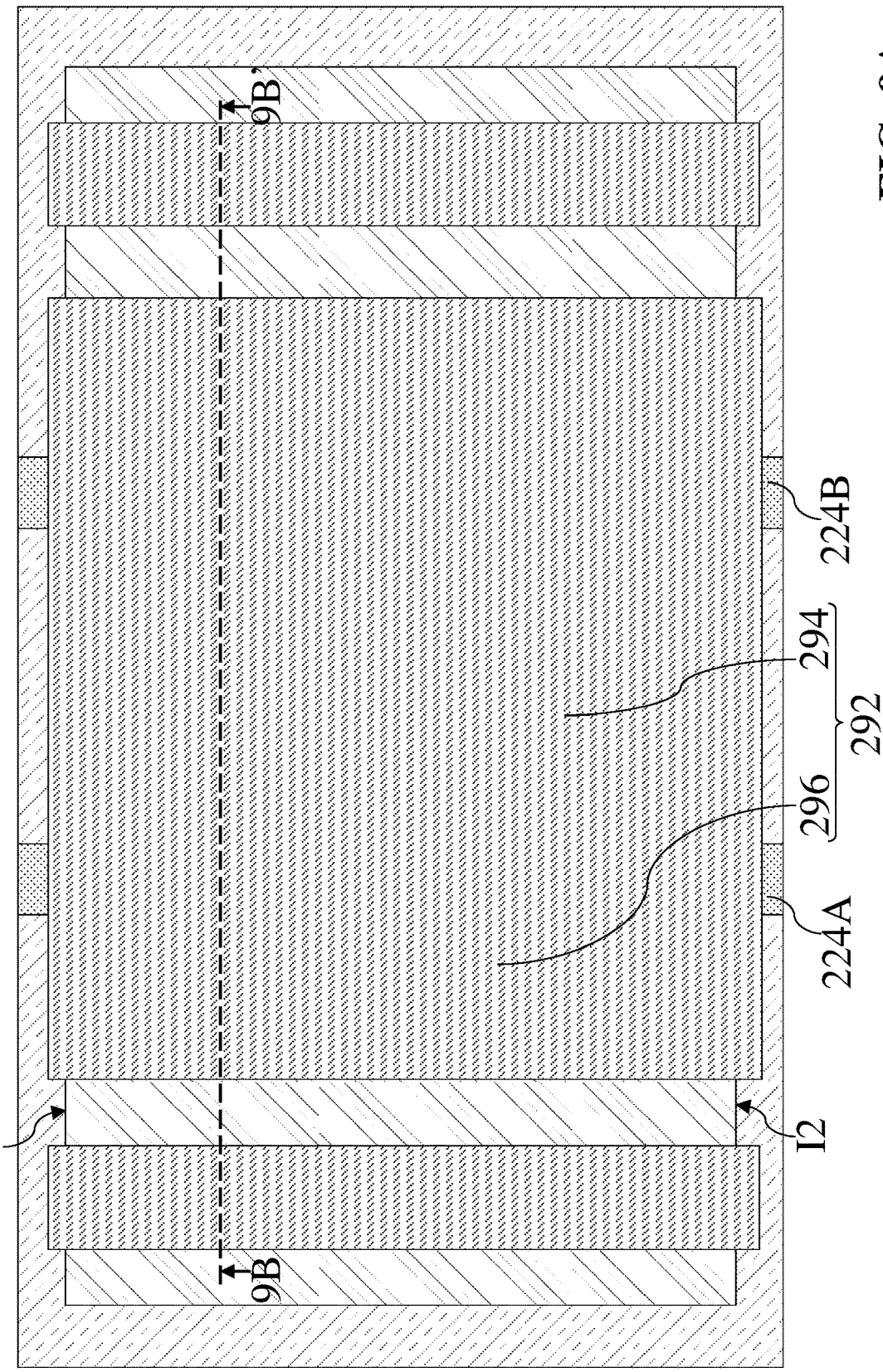
FIG. 9A is a top view of a semiconductor device according to some embodiments of the present disclosure.
Figure 9B:
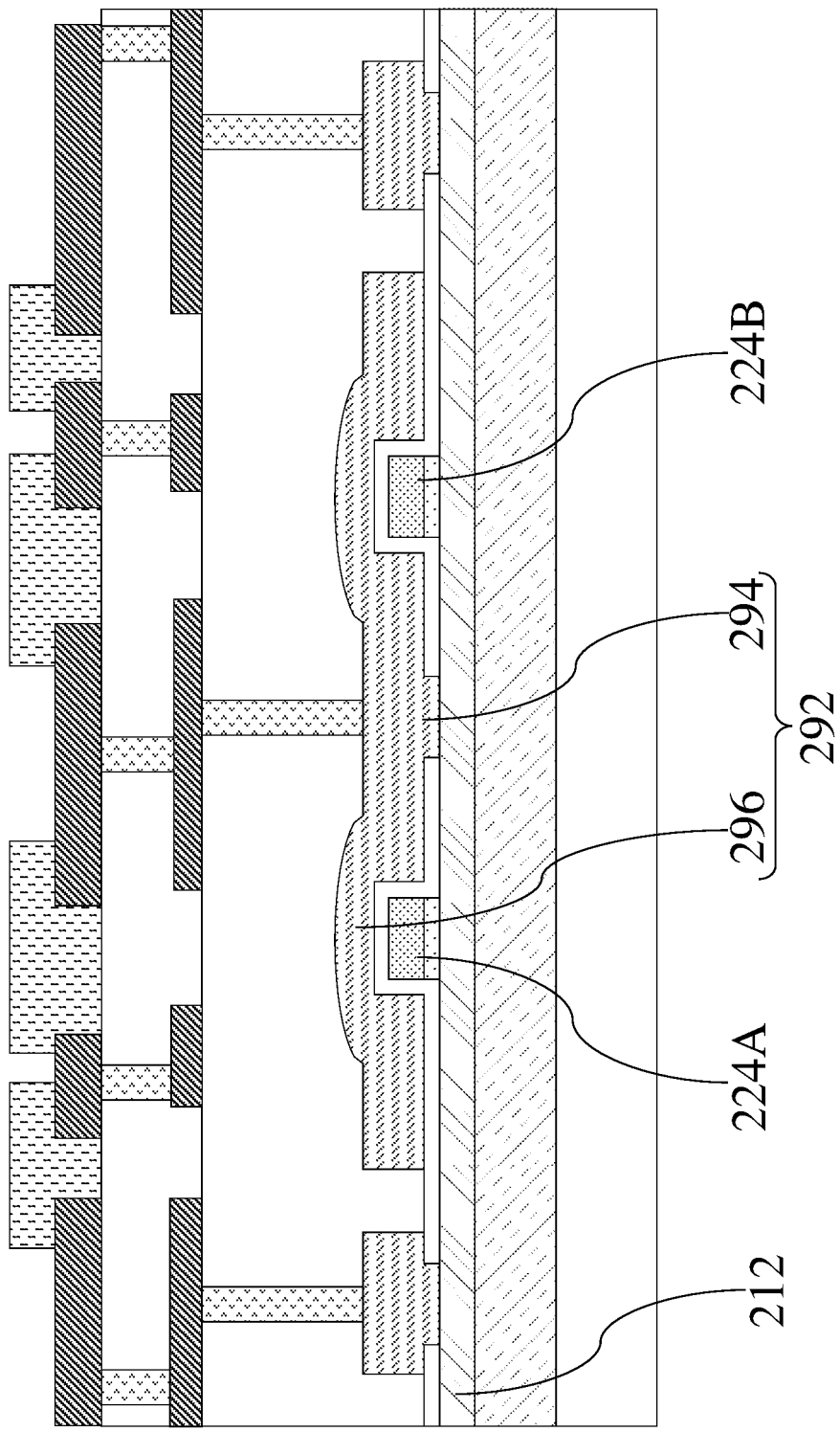
FIG. 9B is a cross-sectional view across a line 9B-9B' the semiconductor device in FIG. 9A.

FIG. 9A is a top view of a semiconductor device 200C according to some embodiments of the present disclosure. FIG. 9B is a cross-sectional view across a line 9B-9B' the semiconductor device 200C in FIG. 9A. In the present embodiment, as shown in the exemplary illustration of FIGS. 9A and 9B, a conductive layer 292 is formed to have an electrode portion 294 and a field plate portion 296, as afore-describe (e.g., FIG. 1A). The electrode portion 294 can serve as a source or a drain in contact with the nitride-based semiconductor layer 212. The field plate portion 296 can be divided into two portions to cover the gate electrodes 224A and 224B, respectively.

The electrode portion 294 and the field plate portion 296 can be made from the same blanket conductive material by a single patterning process. The electrode portion 294 and the field plate portion 296 are physically connected to each other. The conductive layer 292 can be formed to extend across the interfaces I1 and I2 to protect the gate electrodes 224A and 224B. The present embodiment shows the protection to the gate electrode by the field plate is high compatible to the different semiconductor device configurations.

Figure 10:
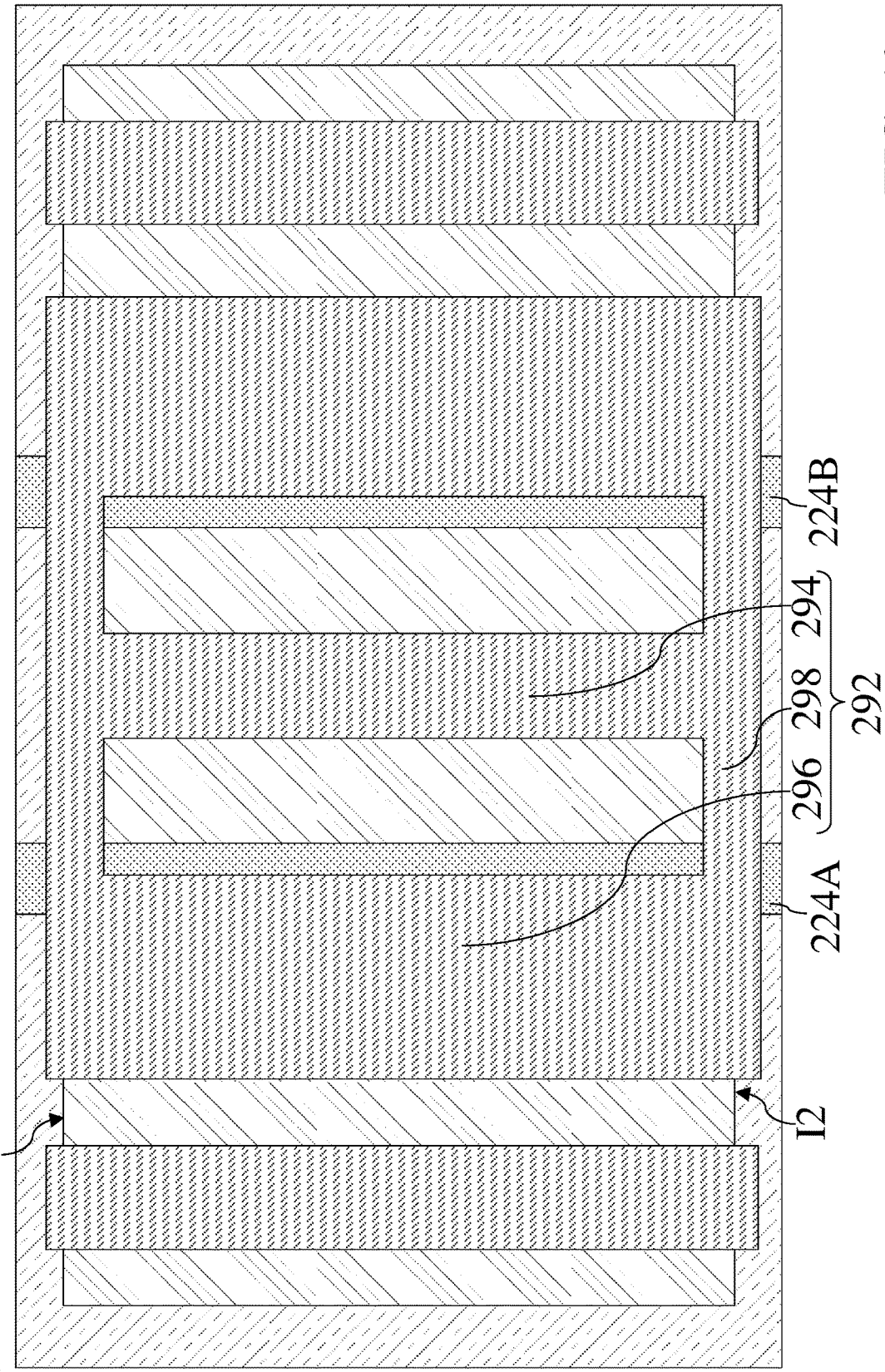
FIG. 10 is a top view of a semiconductor device according to some embodiments of the present disclosure.

FIG. 10 is a top view of a semiconductor device 200D according to some embodiments of the present disclosure. In the present embodiment, as shown in the exemplary illustration of FIG. 10, the conductive layer 292 has at least one aperture/opening to decrease the area, so as to lower accumulation of the stress therein. The conductive layer 292 is formed to extend across the interfaces I1 and I2 to protect the gate electrode 224A and 224B. The conductive layer 292 has a connection portion 298 between the electrode portion 294 and the field plate portion 296. The connection portion 298 of the conductive layer 292 aligns with the interfaces I1 and I2. The field plate portion 296 can be divided into two portions to cover the gate electrodes 224A and 224B, respectively.

Figure 11:
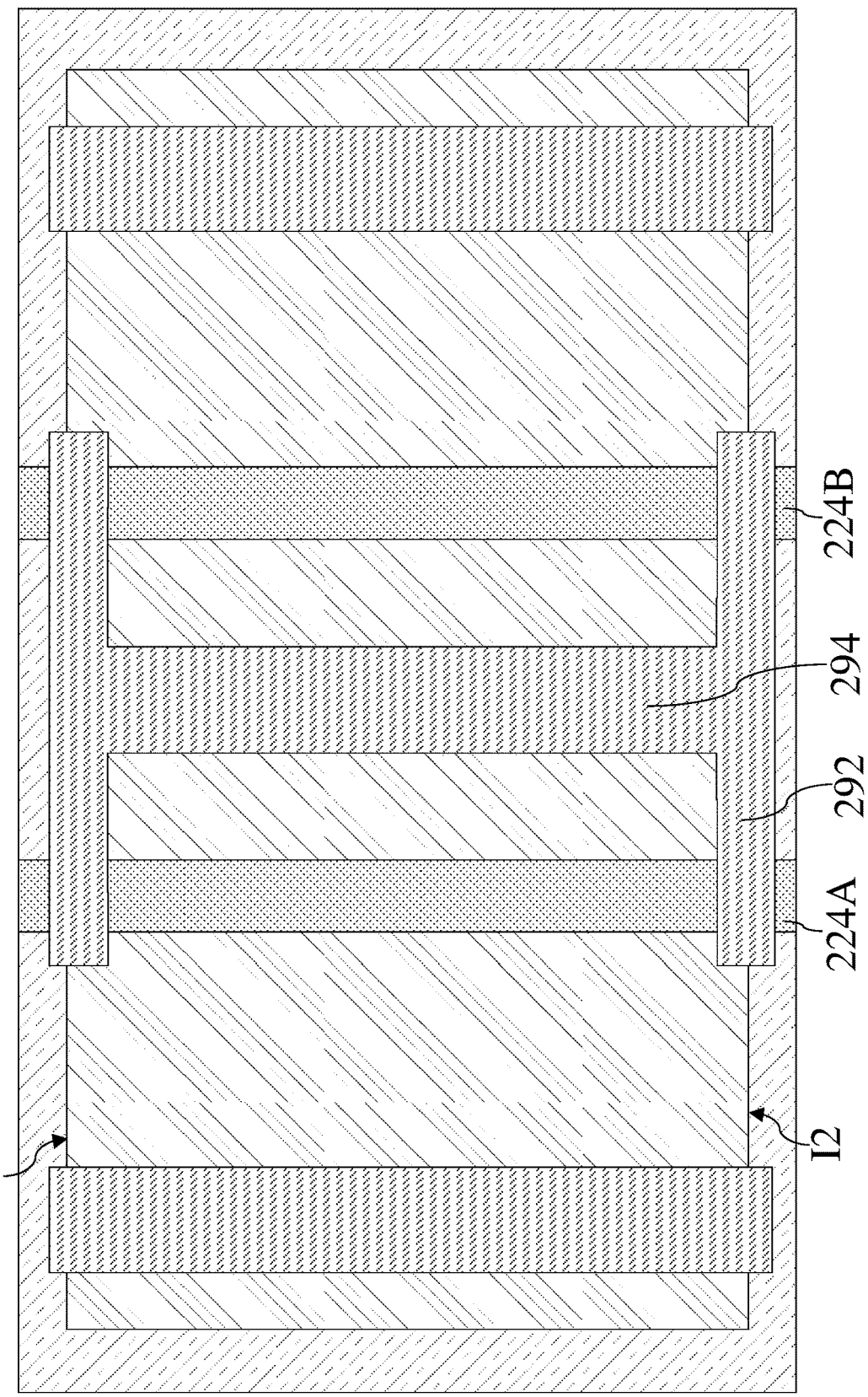
FIG. 11 is a top view of a semiconductor device according to some embodiments of the present disclosure.

FIG. 11 is a top view of a semiconductor device 200E according to some embodiments of the present disclosure. In the present embodiment, as shown in the exemplary illustration of FIG. 11, the conductive layer 292 has the electrode portion 294. The electrode portion 294 have top and bottom edges extending toward the gate electrodes 224A and 224B. The top and bottom edges of the electrode portion 294 horizontally overlap with the interfaces I1 and I2. The top and bottom edges of the electrode portion 294 extend to cover the gate electrodes 224A and 224B so as to protect them from ion bombardment. In some embodiments, the semiconductor device 200E can further include one or more field plate disposed on the conductive layer 292.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to +10% of that numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive.

Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
   a first nitride-based semiconductor layer disposed above a substrate;
   a second nitride-based semiconductor layer disposed on the first nitride-based semiconductor layer and having a bandgap greater than a bandgap of the first nitride-based semiconductor layer, wherein the first and second nitride-based semiconductor layers collectively have an active portion and an electrically isolating portion that is non-semi-conducting and surrounds the active portion to form at least two interfaces extending along a first direction and spaced apart from each other by the active portion;
   a first gate electrode disposed above the second nitride-based semiconductor layer and extending along a second direction different than the first direction and across the two interfaces such that the first gate electrode extends to the electrically isolating portion;
   a first source/drain (S/D) electrode disposed above the second nitride-based semiconductor layer and parallel with the first gate electrode; and
   a first field plate disposed above the second nitride-based semiconductor layer and the first gate electrode and extending along the second direction and across the two interfaces such that the field plate extends to the electrically isolating portion, and overlaps with the first gate electrode near the interfaces;
   wherein the first field plate has two opposite end portions directly over the gate electrode and spaced apart by a first distance which is greater than a second distance from one of the two interfaces to another one of the two interfaces;
   wherein the first field plate has a central portion between the end portions extending along the first direction with respect to the central portion;
   wherein the central portion is within the active portion and is narrower than the end portions.

2. The semiconductor device of claim 1, wherein the first gate electrode and the first field plate horizontally overlap with the two interfaces.

3. The semiconductor device of claim 1, wherein the first gate electrode has a portion within the active portion and free from coverage of the central portion of the first field plate.

4. The semiconductor device of claim 1, further comprising:
   a second gate electrode disposed above the second nitride-based semiconductor layer and extending along the second direction and across the interfaces, wherein the first S/D electrode is located between the first and second gate electrodes; and
   a second field plate disposed above the second nitride-based semiconductor layer and the second gate electrode and extending along the second direction and across the two interfaces, so as to overlap with the second gate electrode near the interfaces.

5. The semiconductor device of claim 4, wherein the first and second field plates are symmetrical about the first S/D electrode.

6. The semiconductor device of claim 1, further comprising:
   a second gate electrode disposed above the second nitride-based semiconductor layer and extending along the second direction and across the interfaces, wherein the first field plate is disposed above the second gate electrode and further extends to vertically overlap with the second gate electrode near the interfaces.

7. The semiconductor device of claim 6, wherein the first S/D electrode is located between the first and second gate electrodes and has a portion free from coverage from the first field plate.

8. The semiconductor device of claim 6, wherein the first S/D electrode is located between the first and second gate electrodes, and the first field plate is ring-shaped and encloses at least one portion of the first S/D electrode.

9. The semiconductor device of claim 1, wherein the first S/D electrode and the first field plate are physically connected to each other.

10. The semiconductor device of claim 9, wherein the first S/D electrode and the first field plate are made from the same conductive material.

11. The semiconductor device of claim 9, further comprising:
    a second gate electrode disposed above the second nitride-based semiconductor layer and extending along the second direction and across the interfaces, wherein the first S/D electrode is located between the first and second gate electrodes; and
    a second field plate disposed above the second nitride-based semiconductor layer and the second gate electrode and extending along the second direction and across the two interfaces, so as to vertically overlap with the second gate electrode near the interfaces, wherein the first S/D electrode is located between the first and second field plates and physically connected to the second field plate.

12. The semiconductor device of claim 1, further comprising:
    a second S/D electrode and a third S/D electrode disposed above the second nitride-based semiconductor layer, wherein the first S/D electrode, the first gate electrode, and the first field plate are located between the second and third S/D electrodes.

13. A method for manufacturing a semiconductor device, comprising:
    forming a first nitride-based semiconductor layer over a substrate;
    forming a second nitride-based semiconductor layer on the first nitride-based semiconductor layer, wherein the first and second nitride-based semiconductor layers collectively have an active portion and an electrically isolating portion that is non-semi-conducting and surrounds the active portion to form at least two interfaces extending along a first direction and spaced apart from each other by the active portion;
    forming a gate electrode over the second nitride-based semiconductor layer;
    forming a field plate above the gate electrode;
    forming a mask layer over the field plate and having opposite edges spaced apart from each other by a distance less than a length of the field plate; and performing an ion implantation process on the second nitride-based semiconductor layer such that the second nitride-based semiconductor layer has an electrically isolating portion exposed from the mask layer;

wherein the field plate has two opposite end portions directly over the gate electrode and spaced apart by a first distance which is greater than a second distance from one of the two interfaces to another one of the two interfaces;

wherein the field plate has a central portion between the end portions extending along the first direction with respect to the central portion, wherein the central portion is within the active portion and is narrower than the end portions.

14. The method of claim 13, wherein the gate electrode extends between the edges of the mask layer along the length of the field plate.

15. The method of claim 13, further comprising:
forming a source/drain (S/D) electrode prior to the formation of the field plate.

16. The method of claim 13, further comprising:
forming a blanket conductive layer above the second nitride-based semiconductor layer; and
patterning the blanket conductive layer to form the field plate and a source/drain (S/D) electrode.

17. The method of claim 13, further comprising:
forming a blanket conductive layer above the second nitride-based semiconductor layer; and
patterning the blanket conductive layer to form the field plate having a ring shape.

* * * * *